(12) United States Patent  
Aoki et al.

(10) Patent No.: US 7,915,058 B2
(45) Date of Patent: Mar. 29, 2011

(54) SUBSTRATE HAVING PATTERN AND METHOD FOR MANUFACTURING THE SAME, AND SEMICONDUCTOR DEVICE AND METHOD FOR MANUFACTURING THE SAME

(75) Inventors: Tomoyuki Aoki, Kanagawa (JP); Koji Dairiki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 417 days.

(21) Appl. No.: 11/334,474

(22) Filed: Jan. 19, 2006

(65) Prior Publication Data

US 2006/0170077 A1    Aug. 3, 2006

(30) Foreign Application Priority Data

Jan. 28, 2005  (JP) .................. 2005-022312

(51) Int. Cl.
   *H01L 21/00*    (2006.01)
(52) U.S. Cl. ........... 438/22; 438/200; 438/715; 438/782
(58) Field of Classification Search .................... 438/22, 438/200, 688, 715, 747, 778, 782, 785
   See application file for complete search history.

(56) References Cited

U.S. PATENT DOCUMENTS

| | | | |
|---|---|---|---|
| 3,793,717 A * | 2/1974 | Degenkolb et al. .......... 29/610.1 |
| 5,200,846 A | 4/1993 | Hiroki et al. |
| 5,218,464 A | 6/1993 | Hiroki et al. |
| 5,289,030 A | 2/1994 | Yamazaki et al. |
| 5,308,998 A | 5/1994 | Yamazaki et al. |
| 5,468,987 A | 11/1995 | Yamazaki et al. |
| 5,474,945 A | 12/1995 | Yamazaki et al. |
| 5,478,460 A * | 12/1995 | Sugama et al. ................. 438/49 |
| 5,485,019 A | 1/1996 | Yamazaki et al. |
| 5,495,121 A | 2/1996 | Yamazaki et al. |
| 5,521,107 A | 5/1996 | Yamazaki et al. |
| 5,545,571 A | 8/1996 | Yamazaki et al. |

(Continued)

FOREIGN PATENT DOCUMENTS

CN    1312333    9/2001

(Continued)

OTHER PUBLICATIONS

Office Action (Chinese Application No. 200610004003.8), dated May 9, 2008.

(Continued)

*Primary Examiner* — Fernando L Toledo
(74) *Attorney, Agent, or Firm* — Nixon Peabody LLP; Jeffrey L. Costellia

(57) ABSTRACT

The present invention provides a method for manufacturing a substrate having a pattern that is capable of controlling the distance between adjacent film patterns, and also provides a method for manufacturing a substrate, particularly, having a pattern with a narrow width and a thickness that is capable of controlling the width between the film patterns. The present invention provides a method for manufacturing a substrate having a conductive film that serves as an antenna with a little variation in inductance and has a large electromotive force, and provides a method for manufacturing a semiconductor device with high yield. After forming a film in which silicon and oxygen are combined and an inactive group is combined with the silicon over a substrate, an insulating film, or a conductive film, a composition is printed by the printing method thereover, and is baked to form a film pattern.

14 Claims, 19 Drawing Sheets

U.S. PATENT DOCUMENTS

| | | | |
|---|---|---|---|
| 5,650,338 A | 7/1997 | Yamazaki et al. | |
| 5,716,871 A | 2/1998 | Yamazaki et al. | |
| 5,821,559 A | 10/1998 | Yamazaki et al. | |
| 5,834,840 A * | 11/1998 | Robbins et al. | 257/705 |
| 5,849,611 A | 12/1998 | Yamazaki et al. | |
| 5,854,494 A | 12/1998 | Yamazaki et al. | |
| 5,879,969 A | 3/1999 | Yamazaki et al. | |
| 5,894,151 A | 4/1999 | Yamazaki et al. | |
| 5,899,709 A | 5/1999 | Yamazaki et al. | |
| 5,913,112 A | 6/1999 | Yamazaki et al. | |
| 5,917,225 A | 6/1999 | Yamazaki et al. | |
| RE36,314 E | 9/1999 | Yamazaki et al. | |
| 5,962,870 A | 10/1999 | Yamazaki et al. | |
| 6,013,928 A | 1/2000 | Yamazaki et al. | |
| 6,028,333 A | 2/2000 | Yamazaki et al. | |
| 6,147,375 A | 11/2000 | Yamazaki et al. | |
| 6,210,750 B1 | 4/2001 | Cho et al. | |
| 6,235,383 B1 | 5/2001 | Hong et al. | |
| 6,291,022 B1 | 9/2001 | Hong et al. | |
| 6,323,528 B1 | 11/2001 | Yamazaki et al. | |
| 6,326,642 B1 | 12/2001 | Yamazaki et al. | |
| 6,331,723 B1 | 12/2001 | Yamazaki et al. | |
| 6,337,133 B1 | 1/2002 | Akamatsu et al. | |
| 6,476,447 B1 | 11/2002 | Yamazaki et al. | |
| 6,525,261 B1 * | 2/2003 | Kubota et al. | 136/243 |
| 6,566,711 B1 | 5/2003 | Yamazaki et al. | |
| 6,580,035 B1 * | 6/2003 | Chung | 174/255 |
| 6,624,450 B1 | 9/2003 | Yamazaki et al. | |
| 6,630,080 B2 | 10/2003 | Matsumora | |
| 6,641,654 B2 | 11/2003 | Akamatsu et al. | |
| 6,709,907 B1 | 3/2004 | Yamazaki et al. | |
| 6,715,871 B2 | 4/2004 | Hashimoto et al. | |
| 6,734,029 B2 | 5/2004 | Furusawa | |
| 6,803,600 B2 | 10/2004 | Yamazaki et al. | |
| 6,822,261 B2 | 11/2004 | Yamazaki et al. | |
| 6,861,377 B1 | 3/2005 | Hirai et al. | |
| 6,953,713 B2 | 10/2005 | Yamazaki et al. | |
| 6,977,392 B2 | 12/2005 | Yamazaki et al. | |
| 7,148,542 B2 | 12/2006 | Yamazaki et al. | |
| 7,223,996 B2 | 5/2007 | Yamazaki et al. | |
| 2001/0017683 A1 | 8/2001 | Hiroki et al. | |
| 2002/0033906 A1 | 3/2002 | Hiroki et al. | |
| 2003/0030689 A1 | 2/2003 | Hashimoto et al. | |
| 2004/0043334 A1 | 3/2004 | Kobayashi et al. | |
| 2004/0207777 A1 | 10/2004 | Hiroki et al. | |
| 2005/0001965 A1 | 1/2005 | Hiroki et al. | |
| 2005/0007329 A1 | 1/2005 | Hiroki et al. | |
| 2005/0098782 A1 | 5/2005 | Yamazaki et al. | |
| 2005/0112810 A1 | 5/2005 | Kobayashi | |
| 2006/0048572 A1 * | 3/2006 | Isogai et al. | 73/335.04 |
| 2006/0060860 A1 | 3/2006 | Yamazaki et al. | |
| 2006/0134918 A1 | 6/2006 | Fujii et al. | |
| 2006/0166411 A1 | 7/2006 | Morisue et al. | |
| 2006/0169973 A1 | 8/2006 | Isa et al. | |
| 2006/0170111 A1 | 8/2006 | Isa et al. | |
| 2007/0096210 A1 | 5/2007 | Yamazaki et al. | |

FOREIGN PATENT DOCUMENTS

| | | |
|---|---|---|
| CN | 1479137 A | 3/2004 |
| EP | 0499979 A2 | 8/1992 |
| EP | 0502749 A2 | 9/1992 |
| EP | 0 825 157 A2 | 2/1998 |
| JP | 10-167763 | 6/1993 |
| JP | 10-259038 | 9/1998 |
| JP | 11-322363 | 11/1999 |
| JP | 2000-208899 | 7/2000 |
| JP | 2004-006700 | 1/2004 |
| JP | 2004-87977 | 3/2004 |
| JP | 2004-335849 | 11/2004 |

OTHER PUBLICATIONS

Ding Yi, "Application of Conductive Ink for Electronic Components", Screen Printing, 2004.1, pp. 27-33, with English Translation.

Chinese Office Action (Application No. 200610004003.8) dated May 8, 2009 with English Translation.

Office Action, (Application No. 200610004003.8; CN8500), Dated Nov. 7, 2008 with English translation.

* cited by examiner

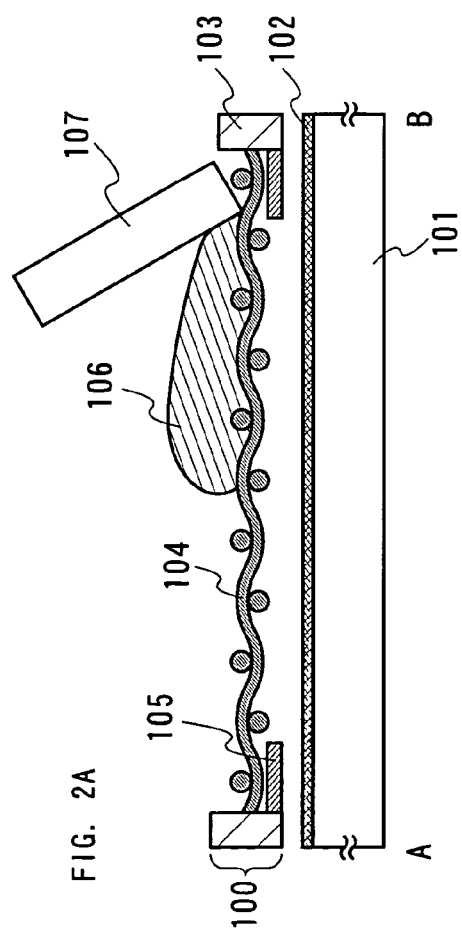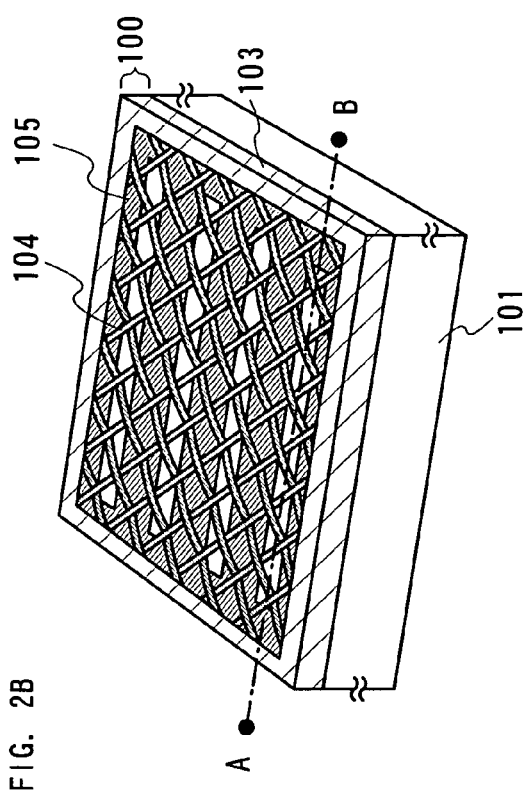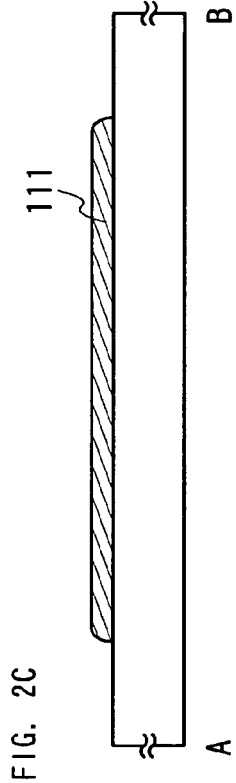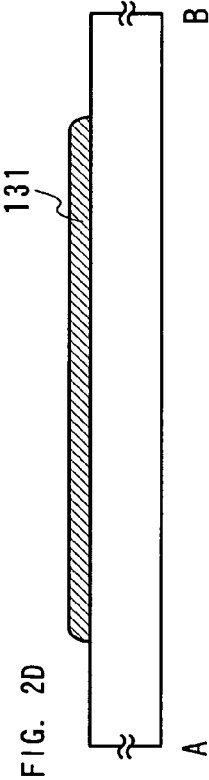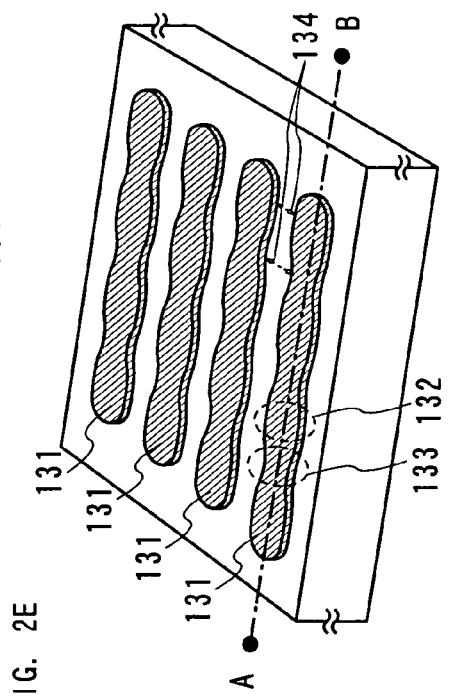

Surface of glass substrate treated with $CF_3(CF_2)_kCH_2CH_2Si(OCH_3)_3$

SUBSTRATE HAVING PATTERN AND METHOD FOR MANUFACTURING THE SAME, AND SEMICONDUCTOR DEVICE AND METHOD FOR MANUFACTURING THE SAME

BACKGROUND OF THE INVENTION

1. Field of the Invention

The present invention relates to substrates having a pattern such as an insulating film, a conductive film, and a semiconductor film that are formed with the use of a screen printing method and to a method for manufacturing thereof. The present invention also relates to a semiconductor device having a film pattern that is formed by a screen printing method and a method for manufacturing thereof.

2. Description of the Related Art

The screen printing method is such a method that, as shown in FIG. 2B, a screen printing plate 100 in which a frame 103 is provided with a wire netting (mesh) 104 and an emulsion 105 for a mask is provided above a substrate 101, and, as shown in FIG. 2A, composition 106 is provided over the screen printing plate and extruded while pushing out with the use of a squeegee 107, a roller, or the like to be applied to the surface of the substrate 101. FIG. 2B shows a perspective view of the substrate provided with the screen printing plate, and FIG. 2A shows a cross-sectional view taken along A-B thereof.

Then, as shown in FIG. 2C, a composition 111 applied over the substrate 101 is dried and baked to form a film pattern 131 as shown in FIGS. 2D and 2E.

The screen printing method has advantages in the production cost and the throughput because the screen printing method needs few number of steps and devices and the method for manufacturing is comparatively simple and easy. Therefore, the screen printing method is adopted in forming steps of a wiring provided over the substrate, a partition wall (bank) and a pixel electrode provided in a plasma display panel and a light-emitting display device, and a solder bump and a package covering semiconductor elements such as IC and LSI, and the like.

However, in the case of printing a composition over the substrate with the use of the screen printing method, the applied composition that fills in mesh opening portions are connected to each other to be a liner composition. Therefore, as a top view shown in FIG. 2E, a composition having a curved (undulant) shape on the side surfaces thereof, which is different from the shape of the mask, are formed at a region 132 of the composition that is applied to fill opening portions and a region 133 of the composition connected thereto. Accordingly, distances 134 between the adjacent film patterns 131 are different. In addition, surfaces of the composition have different film thicknesses corresponding to the opening portions of the mask, and the surfaces are uneven.

A film pattern formed by baking the paste in such a shape has also different distances between adjacent film patterns. In addition, the surface is uneven.

When an antenna such as a wireless chip (also referred to as an ID tag, an IC tag, and IC chip, an RF (Radio Frequency) tag, a wireless tag, an electronic tag, or an RFID (Radio Frequency Identification)) that can receive and transmit data wirelessly by using the above film pattern is formed, the inductance in the antenna changes and resonant frequency decreases thereby reducing electromotive force. In addition, short circuit occurs easily with adjacent antennas.

In the region 133 with a narrow line width of the composition, the composition is easily separated, which results in reduced yield. In addition, depending on the viscosity of the composition, the film thickness of the conductive film becomes thinner. The composition may be printed several times in order to avoid such problems. However, in this case, the number of steps increases and adjacent compositions are, connected to each other.

BRIEF SUMMARY OF THE INVENTION

In view of the foregoing, the present invention provides a method for manufacturing a substrate having a pattern, which is capable of controlling the distance between adjacent film patterns. The present invention also provides a method for manufacturing a substrate having a pattern which is capable of controlling the width between the film patterns, particularly with a narrow width and a thickness. In addition, it is an object of the present invention to provide a method for manufacturing a substrate having a conductive film that serves as an antenna with a little variation in inductance and has a large electromotive force. Further, it is also an object of the present invention to provide a method for manufacturing a semiconductor device with high yield.

According to one aspect of the present invention, a method for manufacturing a substrate having a film pattern and a method for manufacturing a semiconductor device comprise the steps of forming a film in which silicon and oxygen are combined and an inactive group is combined with the silicon over a substrate, an insulating film, or a conductive film; printing composition over the surface of the film in which silicon and oxygen are combined and an inactive group is combined with the silicon with the use of a printing method; and baking the composition to form a film pattern.

The film in which silicon and oxygen are combined and an inactive group is combined with the silicon is formed over an entire surface of a substrate, an insulating film, or a conductive film.

The film pattern is a conductive film, an insulating film, or a semiconductor film.

When the film pattern is a conductive film, the film pattern serves as an antenna, a pixel electrode, and a wiring. When the film pattern is an insulating film, the film pattern serves as a partition wall layer. Further, when the film pattern is a semiconductor film, the film pattern serves as an active region of a semiconductor element.

According to another aspect of the present invention, a method for manufacturing a semiconductor device comprises the steps of forming a semiconductor element over a substrate; forming an insulating film that covers the semiconductor element, the insulating film having an opening portion to expose a part of a conductive film connecting to the semiconductor element; forming a film in which silicon and oxygen are combined and an inactive group is combined with the silicon over the insulating film and the exposed conductive film; printing a composition over the film in which silicon and oxygen are combined and an inactive group is combined with the silicon with the use of the printing method; and baking the composition to form a conductive film.

The film in which silicon and oxygen are combined and an inactive group is combined with the silicon is formed over an entire surface of the insulating film and the exposed conductive film.

Another aspect of the present invention is a substrate having a film in which silicon and oxygen are combined and an inactive group is combined with the silicon and a pattern formed over the film in which silicon and oxygen are combined and an inactive group is combined with the silicon.

The film in which silicon and oxygen are combined and an inactive group is combined with the silicon is formed over an entire surface of the substrate where the film pattern is formed.

The film pattern is a conductive film, an insulating film, or a semiconductor film.

When the film pattern is a conductive film, the film pattern serves as an antenna, a pixel electrode, and a wiring. When the film pattern is an insulating film, the film pattern serves as a partition wall layer. Further, when the film pattern is a semiconductor film, the film pattern serves as an active region of a semiconductor element.

Further, according to another aspect of the present invention, a semiconductor device comprises a semiconductor element over a substrate; a first conductive film connecting to a source region or a drain region in the semiconductor element; a film in which silicon and oxygen are combined and an inactive group is combined with the silicon formed over a surface of the first conductive film; and a second conductive film formed over the film in which silicon and oxygen are combined and an inactive group is combined with the silicon.

The film in which silicon and oxygen are combined and an inactive group is combined with the silicon is formed over an entire surface of the conductive film.

The inactive group in the film in which silicon and oxygen are combined and an inactive group is combined with the silicon is at least one selected from the functional group of a fluoroalkyl group, an alkyl group, a fluoroaryl group, and an aryl group.

In the present invention, by applying a composition over the film in which silicon and oxygen are combined and an inactive group is combined with the silicon with the use of the printing method, unevenness, that is, undulation of the side surfaces of the film pattern can be reduced. Therefore, the film patterns where the width and adjacent distance of which are uniform can be formed.

By using such a film pattern for an antenna, the antenna with a little variation in inductance can be formed. In addition, an antenna having a large electromotive force can be formed. Further, a semiconductor device with a little variation can be manufactured by using the film pattern for a wiring, a partition wall layer, and the like.

BRIEF DESCRIPTION OF THE DRAWINGS

FIGS. 2A to 2E are cross-sectional views and perspective views illustrating steps of forming a film pattern according to the present invention;

DETAILED DESCRIPTION OF THE INVENTION

Figure 1B:
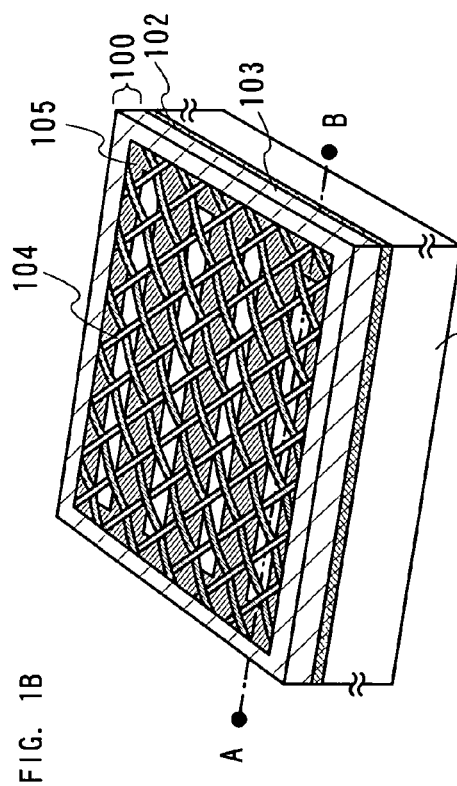
FIGS. 1A to 1E are cross-sectional views and perspective views illustrating steps of forming a film pattern according to the present invention.

Embodiment Mode according to the present invention will be described with references to the accompanying drawings as below. However, it is to be easily understood that various changes and modifications will be apparent to those skilled in the art, unless such changes and modifications depart from the content and the scope of the invention. Therefore, the present invention is not construed as being limited to the description of the following Embodiment Mode. It is to be noted that the same portion or a portion having the same function is denoted by the same reference numeral in all drawings for describing Embodiment Mode, and the description thereof is omitted.

In the present embodiment mode, steps of forming a film pattern by a screen printing method over a substrate will be described with the reference to FIGS. 1A to 1E.

Figure 1E:
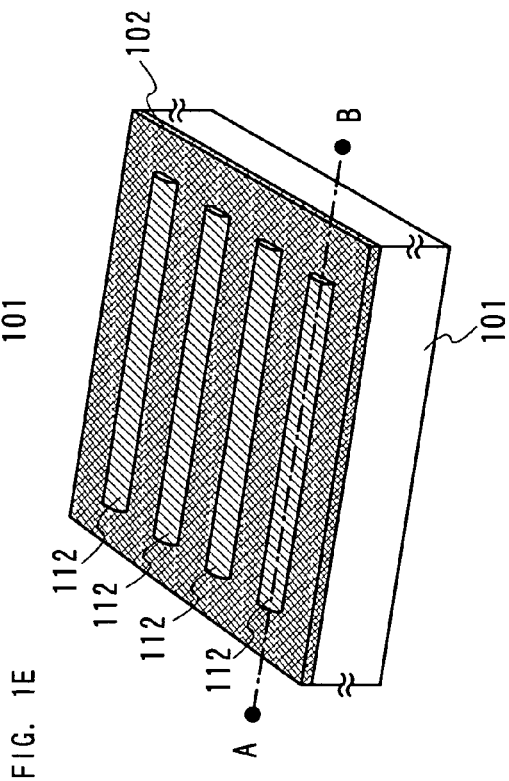
Figure 1A:
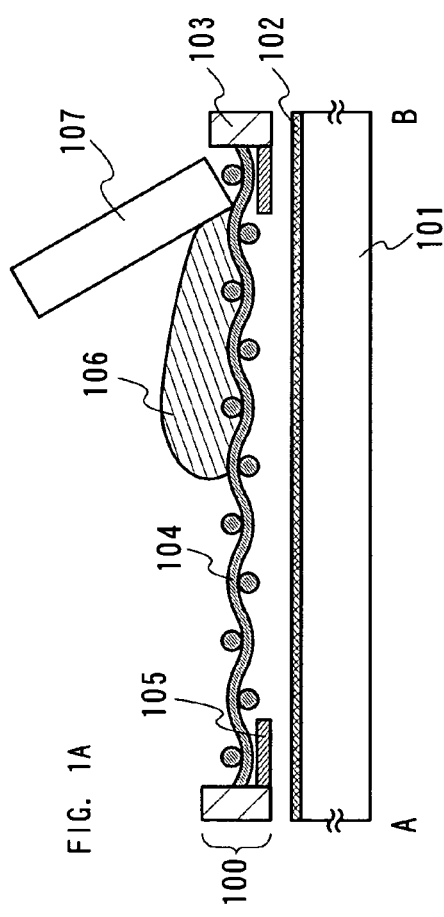
Figure 1C:
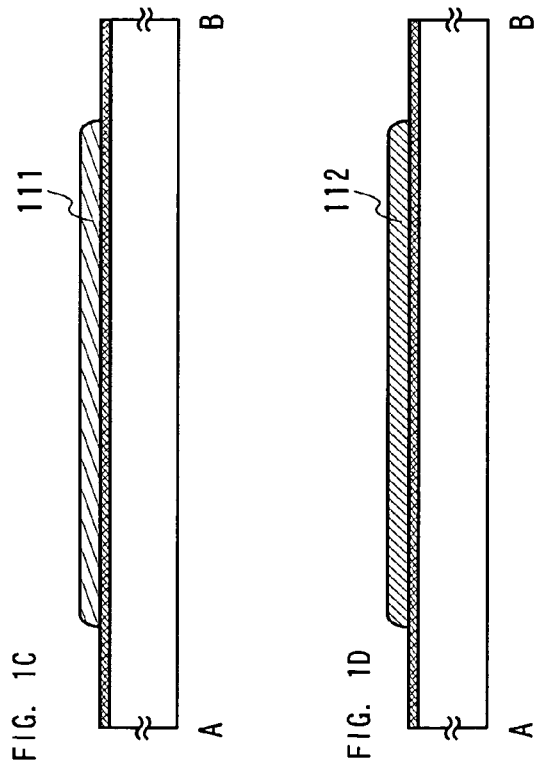
Figure 1D:
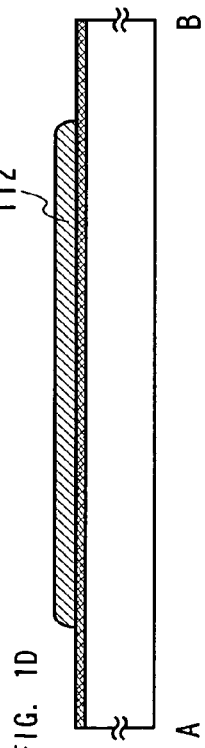

FIGS. 1A, 1C, and 1D are cross-sectional views of a substrate having a pattern, and FIGS. 1B and 1E are perspective views of the substrate having a pattern. Further, FIG. 1A shows the cross-sectional view taken along A-B in FIG. 1B, and FIG. 1D shows the cross-sectional view taken along A-B in FIG. 1E.

A film 102 including oxygen, silicon, and an inactive group is formed over a substrate 101. Next, composition is applied over the film 102 having oxygen, silicon, and an inactive group by a screen printing method. Specifically, a screen printing plate 100 in which a frame 103 is provided with a wire netting (mesh) 104 and an emulsion 105 for masks is provided over the substrate. Then, a composition (paste) 106 is provided over the screen printing plate, and the composition 106 is extruded with the use of a squeegee 107, a roller, or the like. Accordingly, a composition 111 can be applied over the film 102 including oxygen, silicon, and an inactive group (refer to FIGS. 1A to 1C). It is to be noted that the composition may be extended over the screen printing plate by a scraper before extruding the composition with the use of the squeegee and a roller.

Next, a film pattern 112 can be formed by drying and baking the applied composition 111 (refer to FIGS. 1D and 1E).

For the substrate 101, a glass substrate, a quartz substrate, a substrate made of an insulating material such as ceramic, for example, alumina, a plastic substrate, a silicon wafer, a metal plate or the like can be used.

As representative examples of the plastic substrate, a plastic substrate made of PET (polyethylene terephthalate), PEN (polyethylene naphthalate), PES (polyether sulfone), polypropylene, polypropylene sulfide, polycarbonate (PC), polyetherimide, polyphenylene sulfone, polyphenylene oxide, polysulfone, polyphthalamide, nylon, polyetheretherketone (PEEK), polysulfone (PSF), polyetherimide (PEI), polyarylate (PAR), polybutylene terephthalate (PBT), or polyimide, or a substrate formed from an organic material dispersed with inorganic particles of several nanometers in diameter, or the like can be cited. The substrate 101 may have flexibility. Here, polycarbonate is used for the substrate 101.

Further, the film 102 including oxygen, silicon, and an inactive group is formed with the use of composition of an organic silane represented by a chemical formula: Rn—Si—$X_{(4-n)}$ (n=1, 2, 3). R of the organic silane represented by the chemical formula: Rn—Si—$X_{(4-n)}$ (n=1, 2, 3) includes a comparatively inactive group such as a fluoroalkyl group, an alkyl group, a fluoroaryl group, and an aryl group. X is made of a hydrolyzable group capable of combining with a hydroxy group over the surface of a substrate such as halogen, a methoxy group, an ethoxy group, a propyloxy group, an isopropyloxy group, a butoxy group, an isobutoxy group, an s-butoxy group, a t-butoxy group, or an acetoxy group.

As an example of the organic silane, fluoroalkylsilane (hereinafter, referred to as FAS) having a fluoroalkyl group as R can be used. The fluoroalkyl group R of FAS has a structure of $(CF_3)(CF_2)_x(CH_2)_y$, where x is an integer of 0 or more and 10 or less and y is an integer of 0 or more and 4 or less. When a plurality of R or X is combined with Si, all of the R or X may be the same or different. As a typical example of FAS, fluoroalkylsilane such as heptadecafluorotetrahydrodecyltriethoxysilane, heptadecafluorotetrahydrodecyltrichlorosilane, tridecafluorotetrahydrooctyltrichlorosilane, and trifluoropropyltrimethoxysilane can be cited.

As another example of the organic silane, alkoxysilane having an alkyl group as R can be used. As alkoxysilane, the alkyl group having a carbon number of 2 to 30 is preferably used. Typically, ethyltriethoxysilane, propyltriethoxysilane, octyltriethoxysilane, decyltriethoxysilane, octadecyltriethoxysilane (ODS), eicosyltriethoxysilane, and triacontyltriethoxysilane can be cited.

Further, another example of the organic silane, alkoxysilane having an aryl group as R can be used. As alkoxysilane, the aryl group having a carbon number of 6 to 8 is preferably used. Typically, phenyltriethoxysilane, benzyltriethoxysilane, phenethyltriethoxysilane, toluiltriethoxysilane, and the like can be cited.

Furthermore, another example of the organic silane, alkoxysilane having a fluoroaryl group as R can be used. As alkoxysilane, the fluoroaryl group having a carbon number of 6 to 9 is preferably used. Typically, pentafluorophenyltriethoxysilane, (pentafluorophenyl) propyltriethoxysilane, and the like can be cited.

Figure 17:
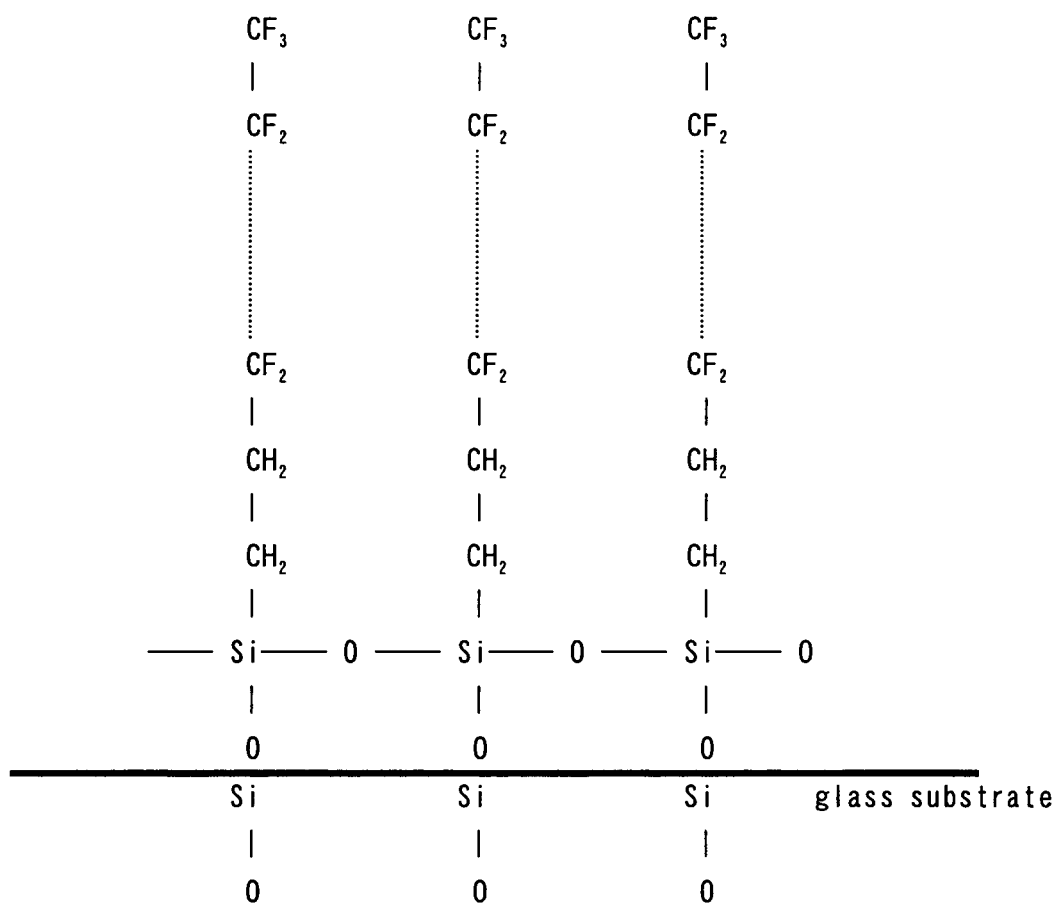
FIG. 17 is a diagram illustrating a surface structure of a modified glass substrate.

Here, a glass substrate is employed as the substrate. FIG. 17 shows a structure of the glass substrate the surface of which is processed with $CF_3(CF_2)_kCH_2CH_2Si(OCH_3)_3$ as one example of the organic silane. A surface of the glass substrate is combined with oxygen, the oxygen is combined with silicon, and the silicon is combined with $CF_3(CF_2)_k$ $CH_2CH_2$ that is a comparatively inactive group. Furthermore, adjacent silicone is combined with oxygen interposed therebetween.

Since the surface of the glass substrate is covered with the comparatively inactive group, surface energy in the surface is relatively small. In addition, a composition having different surface energy is easier to be repelled over the film. For example, the contact angle with water increases in the order of $CF<CF_2<CF_3$, and the surface energy becomes relatively small. Further, the longer the chain of fluorocarbon, the more contact angle tends to increase, and the surface energy tends to become relatively small. Accordingly, the composition flows on a surface of a film having the small surface energy and remains in a stable shape.

Hereinafter, a film formed by processing with organic silane to a surface of a substrate or a member is indicated as a film in which silicon and oxygen are combined and an inactive group is combined with the silicon.

As a solvent used for the composition of the organic silane, hydrocarbon solvent such as n-pentane, n-hexane, n-heptane, n-octane, n-decane, dicyclopentane, benzene, toluene, xylene, durene, indene, tetrahydronaphthalene, decahydronaphthalene, or squalene, tetrahydrofuran, or the like is used.

In the case of forming the film 102 in which silicon and oxygen are combined and an inactive group is combined with the silicon with the use of the above material, the above material is formed by an application method, a liquid phase method, an evaporation method, or the like. In addition, the film 102 may be formed by chemical adsorbing the above material to the surface of the substrate 101. A monomolecular film can be formed by chemical adsorption.

When the film 102 in which silicon and oxygen are combined and an inactive group is combined with the silicon is formed from a monomolecular film, part of the film in which silicon and oxygen are combined and an inactive group is combined with the silicon can be dissolved in a short time in subsequent steps. In addition, since a uniform thickness of the monomolecular film, the film in which silicon and oxygen are combined and an inactive group is combined with the silicon can be dissolved without variations. As a method for forming the monomolecular film, a substrate and composition including organic silane are placed in an airtight container to evaporate so that the organic silane is chemically adsorbed onto the surface of an insulating film, and then the surface is washed with alcohol to form a monomolecular film that includes silicon, oxygen and an inactive group. Further, a substrate may be placed in a solution containing organic silane, so that the organic silane is chemically adsorbed onto the surface of an insulating film to have a monomolecular film. Accordingly, it is possible to form a film in which silicon and oxygen are combined and an inactive group is combined with the silicon.

Here, the film 102 in which silicon and oxygen are combined and an inactive group is combined with the silicon is formed in such a manner that the substrate is placed in an airtight container containing an FAS reagent and heated at a temperature of 50° C. to 200° C., preferably, 100° C. to 200° C. for five minutes or more, so that FAS is adsorbed to the surface of the substrate 101.

The composition 106 can be used appropriately depending on the constitution of a film pattern to be formed. In the case of forming a conductive film pattern, a conductive paste may be used for the composition. As the conductive paste, conductive particles having a diameter of a few nanometers to a few micrometers are used by being dissolved or dispersed in an organic resin. As the conductive particles, one or more element fine particles of Ag, Au, Cu, Ni, Pt, Pd, Ir, Rh, W, Al, Ta, Mo, Cd, Zn, Fe, Ti, Zr, and Ba, silver halide particles, or dispersible nanoparticles may be employed. In addition, conductive films made of these materials can be stacked to form the film pattern 112. Further, as the organic resin included in the conductive paste, one or more organic resins that serve as a binder, a solvent, a dispersing agent, and a coating material that aggregate the metal particles can be used. Typically, an organic resin such as an epoxy resin and a silicone resin can be cited.

In the case of forming an insulating film pattern, an insulating paste may be used for the composition. As the insulating paste, a paste made of insulating particles and a binder can be used. As the insulating particles, silica, alumina, and the like can be cited.

In addition, as the insulating paste, a thermosetting resin, a photo-curing resin, or the like can be used. Typically, there is a paste including polyimide, acrylic, a novolac resin, a melamine resin, a phenol resin, an epoxy resin, a silicone resin, a diallyl phthalate resin, a vinyl chloride resin, a vinyl acetate resin, polyvinyl alcohol, a polystyrene, a methacrylic resin, a polyethylene resin, polypropylene, polycarbonate, polyester, polyamide (nylon), and the like, and also a resist is included. Further, PSG (phosphosilicate glass), BPSG (borophosphosilicate glass), silicate-based SOG (Spin on Glass), polysilazane-based SOG, alkoxy silicate-based SOG, polymethylsiloxane and the like can also be cited.

Further, as the composition, an anisotropic conductive paste with the dispersed conductive particles can be used.

Since the composition is printed over the film including the comparatively inactive group such as a fluoroalkyl group, an alkyl group or the like, oxygen, and silicon, the composition becomes to have such a shape that the surface energy of the composition is stabilized. Therefore, the unevenness (undulation) of the side surfaces of the composition is reduced. A film pattern with the reduced unevenness can be formed by drying and baking such a composition.

Embodiment 1

In the present embodiment, a width of a film pattern in the case of applying and baking a conductive composition by using a screen printing plate that has an emulsion provided with opening portions having different width with each other will be described with the reference to FIG. 16. Here, as a substrate, two types of a glass substrate and a glass substrate having a film in which silicon and oxygen are combined and an inactive group is combined with the silicon are used. As the conductive composition, Ag paste (manufactured by Sumitomo Electric Industries, Ltd., product name: AGEP-201X) (including silver particles, 2-(2-butoxyethoxy)ethyl acetate, and an epoxy resin) is used. In addition, a screen printing plate in which a wire netting thickness is 14 μm and a width of the opening portion of the wire netting is 53 μm, is used. The width of the opening portions of the emulsion in the screen printing plate is set between 30 μm to 180 μm for every 10 μm.

A method for manufacturing the glass substrate having the film in which silicon and oxygen are combined and an inactive group is combined with the silicon is as follows: a tray in which a glass substrate and its surroundings is provided with FAS is placed on a hot plate heated to 170° C.; the tray is sealed, and heated for 10 minutes to adsorb FAS to the surface of the glass substrate; and then, the surface of the glass substrate is washed with ethanol. Then, a film in which silicon and oxygen are combined and an inactive group is combined with the silicon having uniform film thickness is formed.

Next, the screen printing plate is placed with a distance of 1.665 nm from a surface of each substrate. Then, the Ag paste is extended over the screen printing plate with the use of a scraper under the condition of a scraper pressure, 0.182 MPa and a squeegee stroke speed, 20 mm/sec.

Next, the Ag paste is printed over the substrate surface by pushing down a squeegee under the condition of a squeegee pressure; 0.165 MPa, squeegee angle; 80 degree, a squeegee hardness; 80, and a squeegee stroke speed; 8 mm/sec. Then, the Ag paste is baked at 200° C. for 30 minutes to form a film pattern.

Tables 1 to 3 show average values of widths (measured value) of the film pattern formed over the glass substrate having the film in which silicon and oxygen are combined and an inactive group is combined with the silicon. Table 1 shows the average values of the widths (measured value) of the film pattern (sample 1) formed by using the Ag paste having viscosity of 40 Pa·s. Table 2 shows the average values of the widths (measured value) of the film pattern (sample 2) formed by using the Ag paste having viscosity of 200 Pa·s. Table 3 shows the average values of the widths (measured value) of the film pattern (sample 3) formed by using the Ag paste having viscosity of 400 Pa·s. In addition, Tables 4 to 6 show average values of widths (measured value) of the film pattern over the glass substrate. Table 4 shows the average values of the widths (measured value) of the film pattern (sample 4) formed by using the Ag paste having viscosity of 400 Pa·s. Table 5 shows the average values of the widths (measured value) of the film pattern (sample 5) formed by using the Ag paste having viscosity of 200 Pa·s. Table 6 shows the average values of the widths (measured value) of the film pattern (sample 6) formed by using the Ag paste having viscosity of 400 Pa·s. Further, FIG. 16 shows a relation between a designed value of opening portions in the screen printing plate and widths of the film pattern on each substrate in accordance with Tables 1 to 6.

TABLE 1

| designed value of opening portions in screen printing plate (μm) | 30 | 40 | 50 | 60 | 70 | 80 | 90 | 100 |
|---|---|---|---|---|---|---|---|---|
| average value of width (measured value) of film pattern (μm) | 32 | 47 | 62 | 75 | 82 | 91 | 95 | 99 |
| designed value of opening portions in screen printing plate (μm) | 110 | 120 | 130 | 140 | 150 | 160 | 170 | 180 |
| average value of width (measured value) of film pattern (μm) | 103 | 113 | 121 | 132 | 139 | 149 | 158 | 162 |

TABLE 2

| designed value of opening portions in screen printing plate (μm) | 30 | 40 | 50 | 60 | 70 | 80 | 90 | 100 |

TABLE 2-continued

| average value of width (measured value) of film pattern (μm) | 32 | 43 | 55 | 67 | 77 | 85 | 90 | 96 |
| designed value of opening portions in screen printing plate (μm) | 110 | 120 | 130 | 140 | 150 | 160 | 170 | 180 |
| average value of width (measured value) of film pattern (μm) | 90 | 97 | 110 | 122 | 135 | 146 | 154 | 157 |

TABLE 3

| designed value of opening portions in screen printing plate (μm) | 30 | 40 | 50 | 60 | 70 | 80 | 90 | 100 |
| average value of width (measured value) of film pattern (μm) | 28 | 41 | 57 | 67 | 75 | 84 | 93 | 99 |
| designed value of opening portions in screen printing plate (μm) | 110 | 120 | 130 | 140 | 150 | 160 | 170 | 180 |
| average value of width (measured value) of film pattern (μm) | 97 | 105 | 118 | 127 | 138 | 147 | 158 | 162 |

TABLE 4

| designed value of opening portions in screen printing plate (μm) | 30 | 40 | 50 | 60 | 70 | 80 | 90 | 100 |
| average value of width (measured value) of film pattern (μm) | — | 73 | 89 | 111 | 126 | 139 | 146 | 150 |
| designed value of opening portions in screen printing plate (μm) | 110 | 120 | 130 | 140 | 150 | 160 | 170 | 180 |
| average value of width (measured value) of film pattern (μm) | 157 | 165 | 174 | 170 | 192 | 194 | 208 | 208 |

TABLE 5

| designed value of opening portions included in screen printing plate (μm) | 30 | 40 | 50 | 60 | 70 | 80 | 90 | 100 |
| average value of width (measured value) of film pattern (μm) | — | 60 | 86 | 100 | 111 | 120 | 132 | 135 |
| designed value of opening portions included in screen printing plate (μm) | 110 | 120 | 130 | 140 | 150 | 160 | 170 | 180 |
| average value of width (measured value) of film pattern (μm) | 135 | 143 | 154 | 163 | 169 | 179 | 186 | — |

TABLE 6

| designed value of opening portions included in screen printing plate (μm) | 30 | 40 | 50 | 60 | 70 | 80 | 90 | 100 |
| average value of width (measured value) of film pattern (μm) | — | 57 | 75 | 95 | 105 | 111 | 121 | 126 |
| designed value of opening portions included in screen printing plate (μm) | 110 | 120 | 130 | 140 | 150 | 160 | 170 | 180 |
| average value of width (measured value) of film pattern (μm) | 131 | 137 | 148 | 162 | 178 | 184 | 191 | — |

Figure 16:
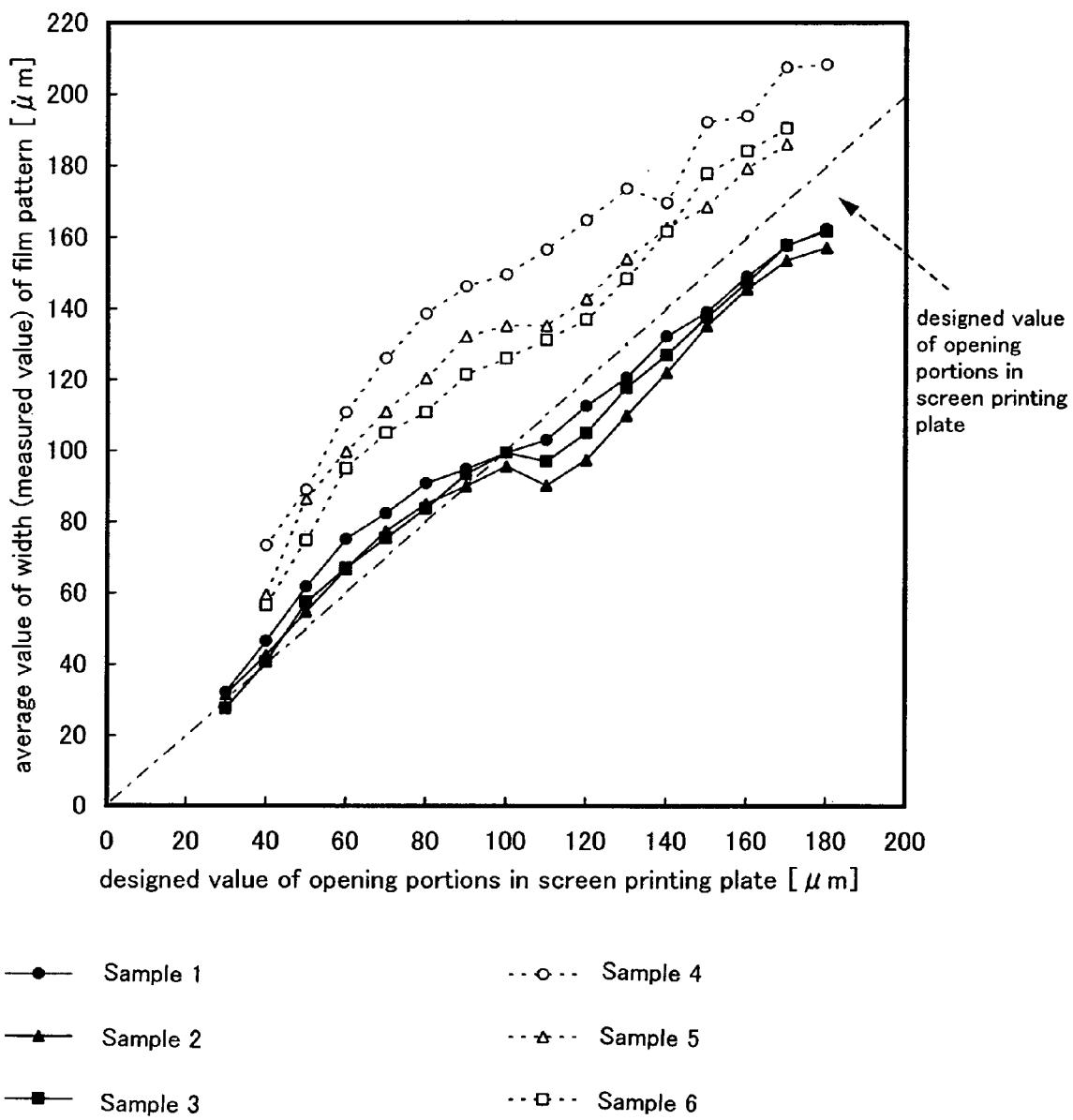
FIG. 16 is a graph showing a relation between designed value of opening portions in a screen printing plate and average values of widths of the film pattern.

In FIG. 16, the horizontal axis denotes the designed value of the opening portions in the screen printing plate, and the vertical axis denotes the average value of the measured value for the width of the film pattern. In addition, the solid lines denote the width of the film patterns (samples 1 to 3) over the glass substrate over which the film in which silicon and oxygen are combined and an inactive group is combined with the silicon is formed. The broken lines denote the width of the film patterns (samples 4 to 6) over the glass substrate. Further, each of the circular marks denotes the measured value of the width of the film patterns (samples 1 and 4) when the Ag paste has viscosity of 40 Pa·s. Each of the triangle marks denotes the measured value of the width of the film patterns (samples 2 and 5) when the Ag paste has viscosity of 200 Pa·s. Each of the rectangular marks denotes the measured value of the width of the film patterns (samples 3 and 6) when the Ag paste has viscosity of 400 Pa·s.

As shown in FIG. 16, the film pattern formed over the glass substrate becomes thicker than the designed value of the screen printing plate. On the other hand, the film pattern formed over the film in which silicon and oxygen are combined and an inactive group is combined with the silicon becomes slightly thicker in the range of the designed value of the screen printing plate between 30 to 80 μm, compared with the designed value of the screen printing plate. It is to be noted that the width of this film pattern becomes thinner than that of the film pattern formed over the glass substrate. In addition, in the range of the designed value of the screen printing plate between 90 to 100 μm, the width of the film pattern is approximately the same as the designed value of the screen printing plate. Further, in the range of the designed value of the screen printing plate between 110 to 180 µm, the width of the film pattern becomes slightly thinner compared with the designed value of the screen printing plate.

In accordance with the above result, it is possible to control the width of the film pattern by applying the composition over the film in which silicon and oxygen are combined and an inactive group is combined with the silicon with the use of the screen printing method.

Figure 18A:
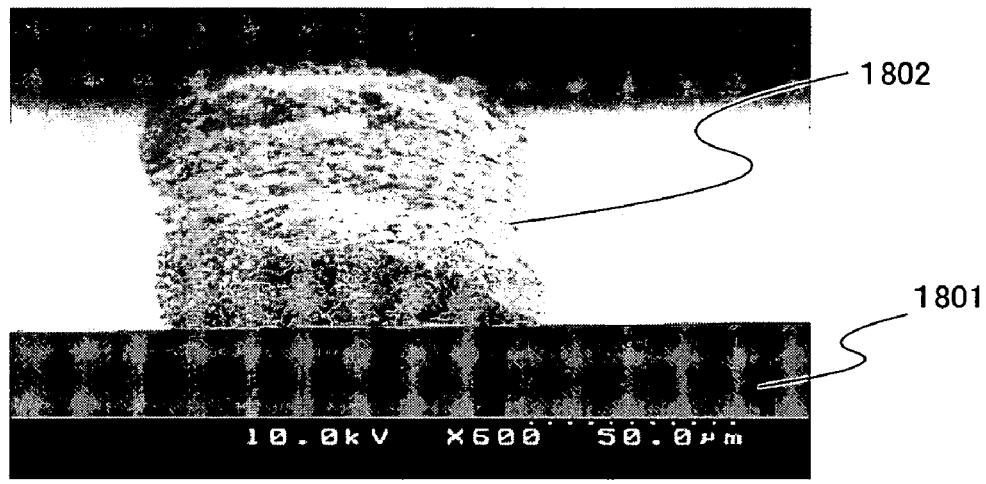
FIGS. 18A and 18B are SEM views of cross-section of a film pattern.
Figure 18B:
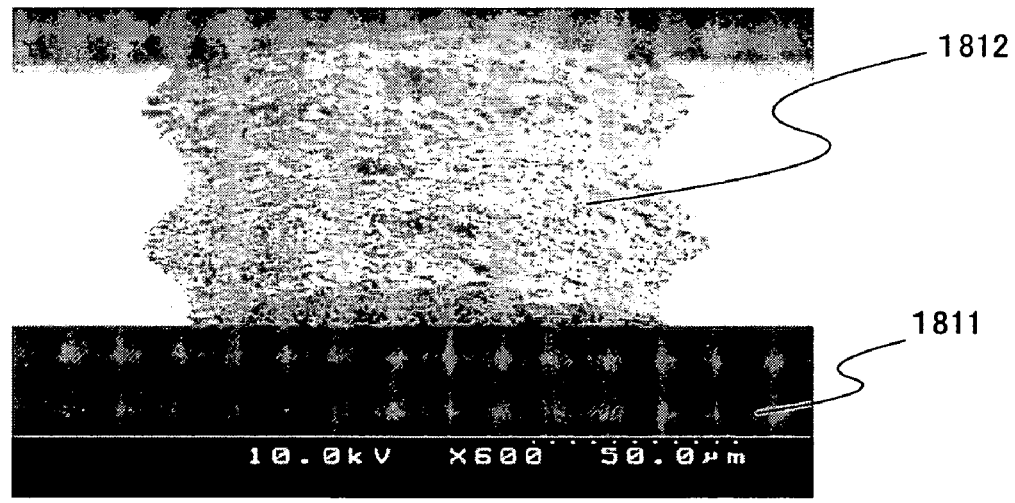

Next, FIGS. 18A and 18B show SEM views (observed from front upper part) of cross-section of the film pattern that is formed with the use of the screen printing plate having a width of 110 µm of the opening portion in the emulsion according to the above described condition.

FIG. 18A shows a film pattern 1802 formed over a glass substrate 1801 having a film in which silicon and oxygen are combined and an inactive group is combined with the silicon. It is to be noted that the film in which silicon and oxygen are combined and an inactive group is combined with the silicon is difficult to be observed by a SEM because of a monomolecular film. The width of the film pattern is 98 µm, and the maximum film thickness is 19 µm. On the other hand, FIG. 18B shows a film pattern 1812 formed over a glass substrate 1811. The width of the film pattern is 148 µm, and the maximum film thickness is 13 µm. Accordingly, when the composition is printed over the glass substrate having oxygen, silicon, and an inactive group thereon, a film pattern having approximately the same width as opening portions and reduced unevenness in side surfaces can be formed.

Next, the electrical resistance of a conductive film was measured through the film in which silicon and oxygen are combined and an inactive group is combined with the silicon will be described with the reference to FIGS. 19A and 19B.

Figure 19A:
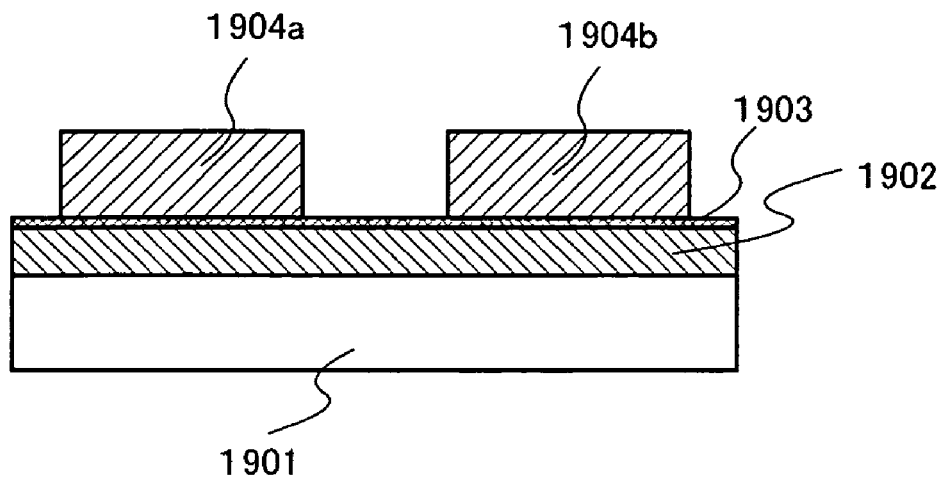
FIGS. 19A and 19B are views illustrating a structure of an element in which resistivity of a film pattern is measured.
Figure 19B:
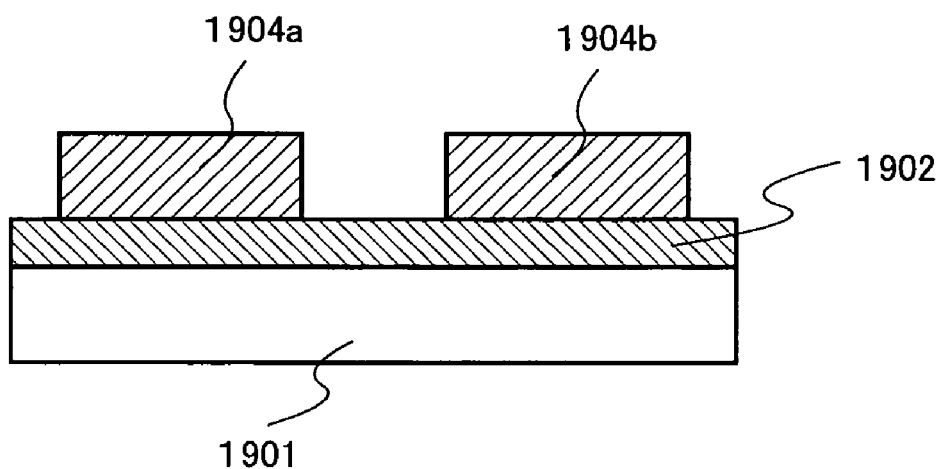

As shown in FIG. 19A, an aluminum film 1902 having a film thickness of 5 µm is formed over a glass substrate 1901 by sputtering. Next, FAS is adsorbed onto the aluminum film 1902 by the above method, and the glass substrate 1901 is washed with alcohol to form a film 1903 in which silicon and oxygen are combined and an inactive group is combined with the silicon. The film in which silicon and oxygen are combined and an inactive group is combined with the silicon has an extremely thin film thickness and is difficult to observe by a SEM. Then, on the film 1903 in which silicon and oxygen are combined and an inactive group is combined with the silicon, Ag films 1904a and 1905b having film thicknesses of 5 µm are formed by applying and baking the Ag paste by the above method to manufacture a sample A. In addition, as shown in FIG. 19B, an aluminum film 1902 having a film thickness of 5 µm is formed over a glass substrate 1901 by sputtering. Then, Ag films 1904a and 1904b having film thicknesses of 5 µm are formed by applying and baking the Ag paste over the aluminum film by the printing method to manufacture a sample B.

In each of the sample A and the sample B, when the electric resistivity between the Ag films 1904a and 1904b is measured with the use of the tester, the resistivity of the sample A and the sample B is respectively 0.2Ω. Accordingly, it is found that the conductive films can conduct through the film in which silicon and oxygen are combined and an inactive group is combined with the silicon.

Embodiment 2

In the present embodiment, steps of forming a film pattern having conductivity and a semiconductor device having the film pattern according to the present invention will be described with the reference to FIGS. 3A to 3E. As the semiconductor device, semiconductor devices such as a wireless chip, a wireless tag, a wireless IC, an RFID, and an IC tag are used for description. In addition, in the present embodiment, as the film pattern having conductivity, an antenna that is capable of receiving and transmitting data wirelessly is used for description.

Figure 3A:
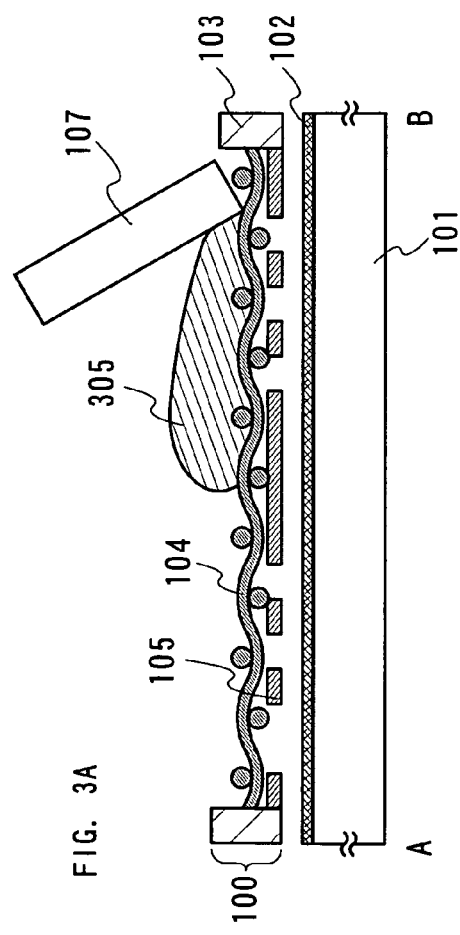
FIGS. 3A to 3E are cross-sectional views and perspective views illustrating steps of forming an antenna according to the present invention.
Figure 3B:
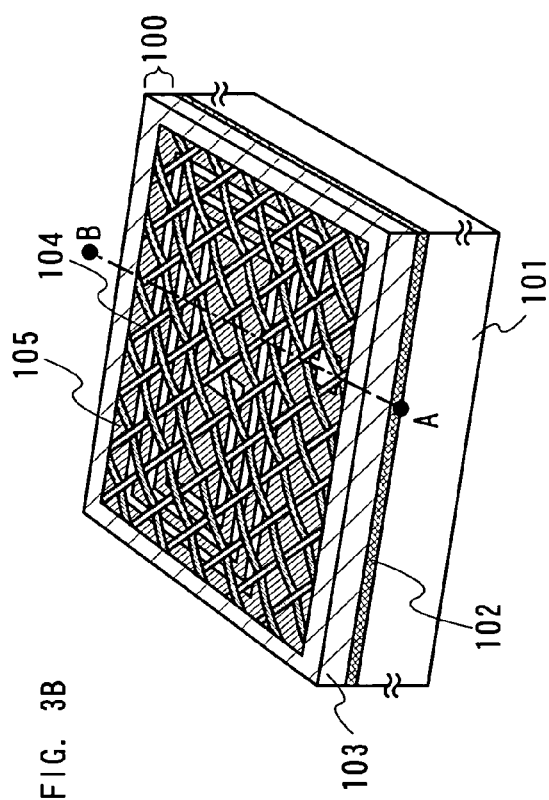
Figure 3C:
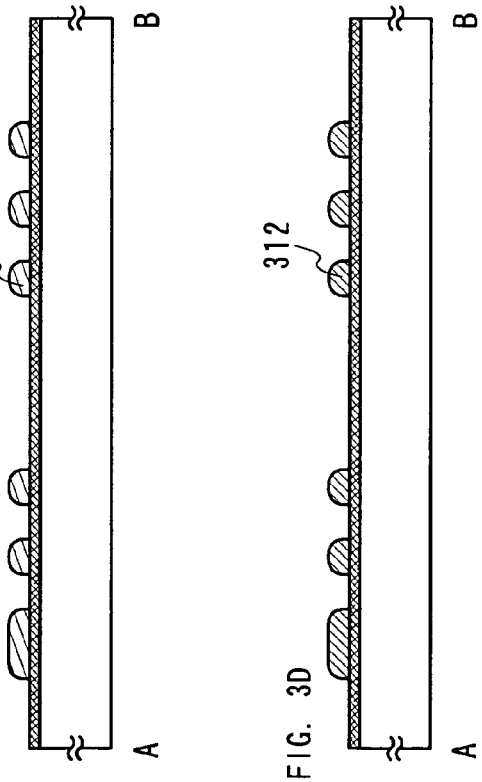
Figure 3D:
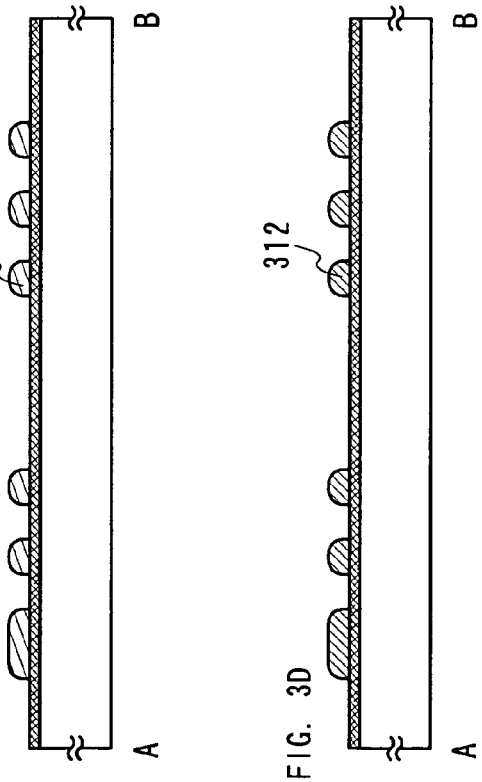
Figure 3E:
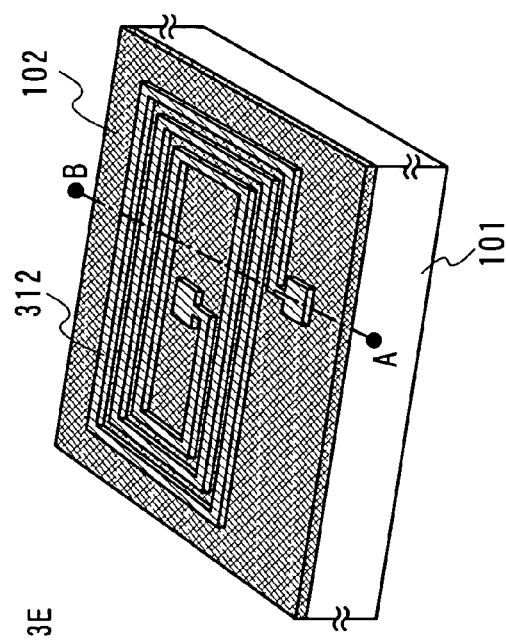

FIGS. 3A, 3C, and 3D show cross-sectional views of a substrate having an antenna. FIGS. 3B and 3E show perspective views of the substrate having the antenna. In addition, FIG. 3A shows the cross-sectional view taken along A-B in FIG. 3B, and FIG. 3D shows the cross-sectional view taken along A-B in FIG. 3E.

A film 102 in which silicon and oxygen are combined and an inactive group is combined with the silicon is formed over a substrate 101. Next, a composition is applied by a screen printing method over the film 102 in which silicon and oxygen are combined and an inactive group is combined with the silicon. Specifically, a screen plate in which a frame 103 provided with a wire netting (mesh) 104 and an emulsion 105 for a mask is provided over the substrate. Then, a conductive composition 305 is provided over a screen plate 100, and the conductive composition 305 is extruded with the use of a squeegee 107. Accordingly, a conductive composition 313 can be applied over the film 102 in which silicon and oxygen are combined and an inactive group is combined with the silicon (refer to FIGS. 3A to 3C).

In the present embodiment, a glass substrate is used. The film 102 in which silicon and oxygen are combined and an inactive group is combined with the silicon is formed by adsorbing FAS to the substrate surface. Further, Ag paste is used for the conductive composition 305.

Next, the applied composition 313 is dried and baked to form a coiled antenna 312 (refer to FIGS. 3D and 3E).

In accordance with the above steps, an antenna that has reduced unevenness in the side surfaces thereof can be formed. In addition, a substrate having the antenna can be formed. The distance between the conductive films is made uniform. Accordingly, an antenna with a little variation in inductance and a large electromotive force can be formed.

Next, a semiconductor device represented by the wireless chip that is formed with the use of the above substrate having the antenna will be described with references to FIGS. 4A to 4C and FIGS. 5A and 5B.

The semiconductor device according to the present invention has a structure in which a plurality of circuits is integrated. A layer 530 including a plurality of filed-effect transistors is formed therein. In addition, an antenna is formed over the substrate. In the present embodiment, a substrate 531 having the antenna as the film pattern formed in embodiment mode 1 is shown (refer to FIG. 4A). The layer 530 including a plurality of field-effect transistors has various pluralities of field-effect transistors.

First, a sectional structure of the layer 530 including a plurality of field-effect transistors is described. Field-effect transistors 511 and 512 are formed over a single crystal semiconductor substrate 500, with element isolation regions 506a to 506c interposed. The field-effect transistors 511 and 512 can be formed by a known method.

On the other hand, a conductive connecting terminal 312a is formed over the substrate 531 having an antenna 321.

Figure 4A:
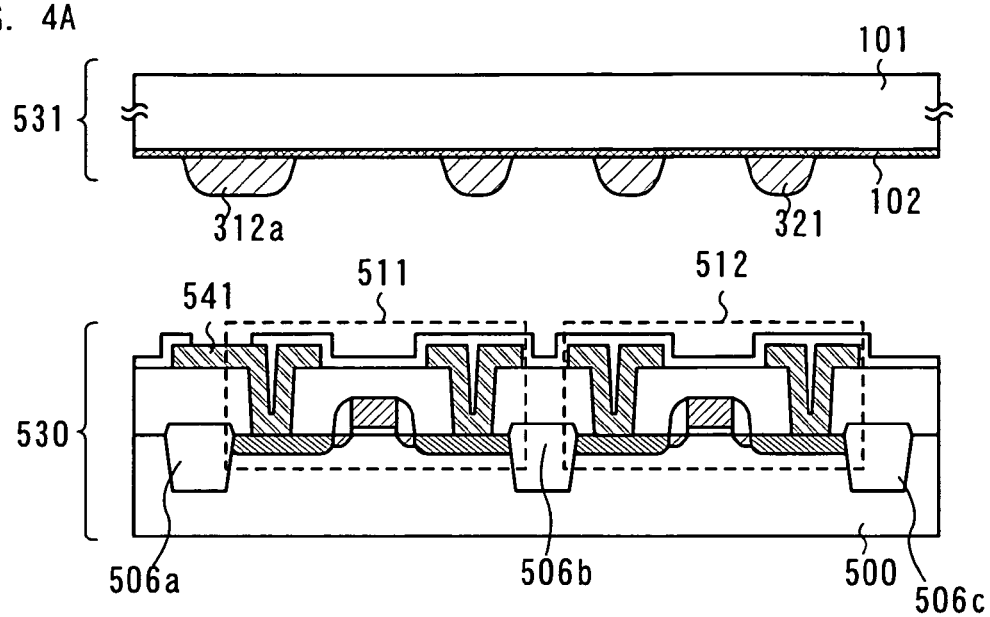
FIGS. 4A to 4C are cross-sectional views illustrating a structure of a semiconductor device according to the present invention.
Figure 4B:
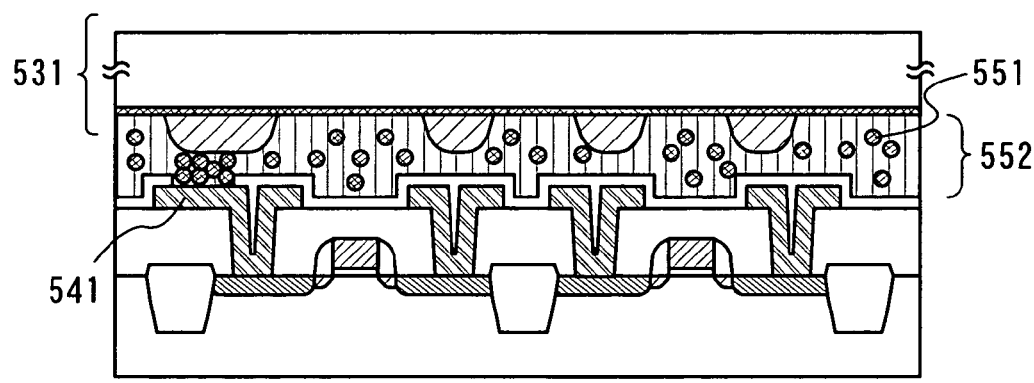
Figure 4C:
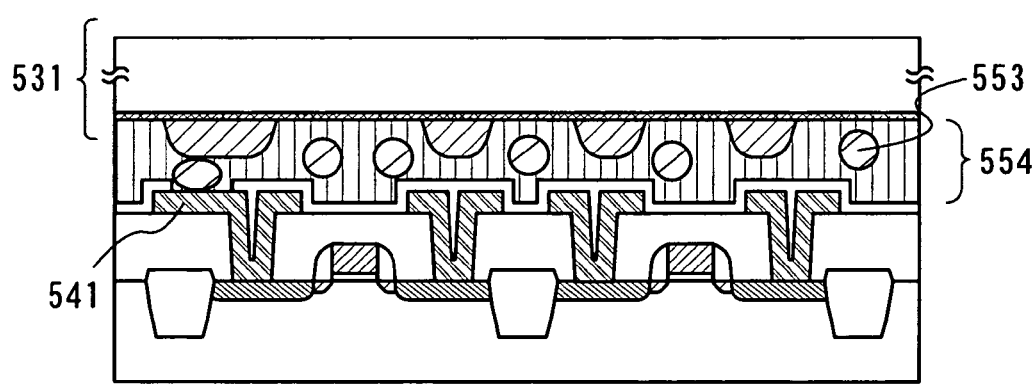

As shown in FIGS. 4A to 4C, the semiconductor device is completed by connecting a conductive layer 541 of the field-effect transistor 511 to the connecting terminal 312a. Specifically, the substrate 531 having the antenna and the layer 530 including a plurality field-effect transistors are attached with an anisotropic conductive adhesive 552. In the anisotropic conductive adhesive 552, conductive particles 551 are dispersed. The connecting terminal 312a of the antenna and the conductive layer 541 serving as a source electrode or a drain electrode of the field-effect transistor 511 are connected with the conductive particles 551 interposed therebetween.

As the representative example of the anisotropic conductive adhesive, an adhesive resin containing the dispersed conductive particles 551 (the particle size of which is several nanometers to several tens micrometers) such as an epoxy resin or a phenol resin can be cited. In addition, the conductive particles 551 are made of one or more elements of gold, silver, copper, palladium and platinum. Further, the conductive particles 551 may be particles having a multilayer structure of these elements. Furthermore, as the conductive particles, a thin film made of one or more elements selected from gold, silver, copper, palladium, and platinum may be formed over the surface of particles made of resin.

When the diameter of the conductive particles 551 is 1 to 100 nm, preferably 5 to 50 nm, one or a plurality of conductive particles 551 are connected to the connecting terminal 312a. In this case, one or a plurality of the conductive particles 551 keep the distance between the connecting terminal 312a and the conductive layer 541.

Further, as shown in FIG. 4C, an adhesive layer 554 including conductive particles 553 the diameter of which is 0.5 to 10 μm, preferably, 1 to 5 μm may be used. In this case, the conductive layer 541 and the connecting terminal 312a are connected through the conductive particle 553 with the crushed shape in vertical direction. The conductive particles 553 keep the distance between the conductive layer 541 and the connecting terminal 312a.

Instead of the field-effect transistor, a layer including a TFT provided over an insulating substrate may be used.

Next, an example in which a circuit is formed with the used of a TFT instead of the single crystal semiconductor substrate and an antenna is connected at the backside of the TFT is described with reference to FIGS. 5A and 5B. Here, the backside of the TFT indicates an insulating film 703 side where the TFT is provided.

Figure 5A:
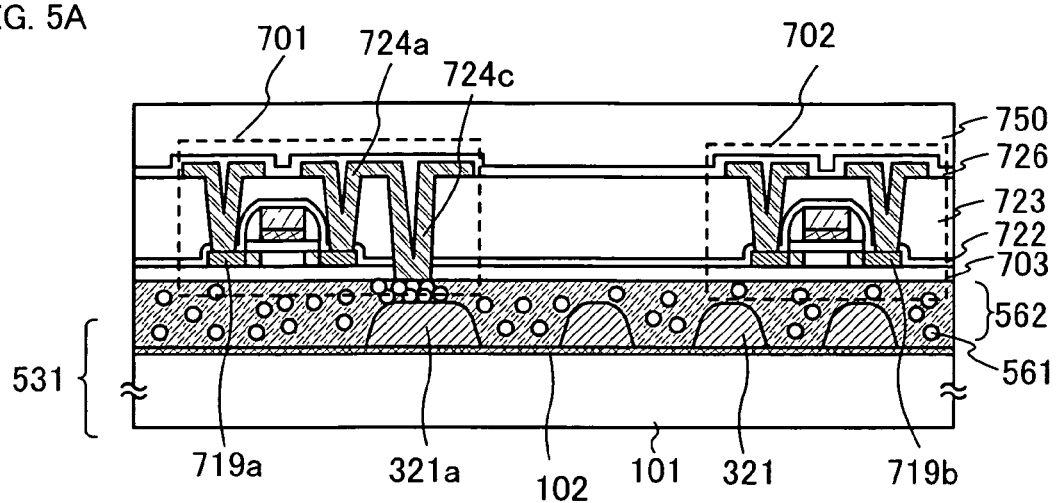
FIGS. 5A and 5B are cross-sectional views illustrating a structure of a semiconductor device according to the present invention.

As shown in FIG. 5A, a base material 750 is provided over a layer including TFTs 701 and 702 that are provided over the substrate. Then the layer including the TFTs 701 and 702 is separated from the substrate, and a substrate 531 having the antenna 321 can be attached to the separated side with an anisotropic conductive adhesive 562 (refer to FIG. 5A).

A conductive film 724a serving as a source wiring or a drain wiring of the TFT 701 has a region 724c that fills an opening portion of insulating films 723, 722, and 703. Therefore, since the conductive film is exposed in the opening portion of the insulating film 703, it is possible to connect the conductive film serving as the antenna and the TFT on the backside of the TFT. Then, the opening portion of the insulating films 723, 722, and 703 can be formed as follows: source and drain regions 719a and 719b and the insulating film 703 are exposed by etching the insulating films 723 and 722; and the exposed portion of the insulating film 703 is etched to form an opening portion.

For the base material 750, the substrate 101 shown in the embodiment mode or a film can be used. As the film, a film formed using polypropylene, polyester, vinyl, polyvinyl fluoride, polyvinyl chloride or the like, paper of a fibrous material, a stacked film of a base material film (polyester, polyamide, an inorganic vapor deposition film, paper, or the like) and an adhesive synthetic resin film (an acrylic-based synthetic resin, an epoxy-based synthetic resin, or the like) or the like can be used. The thermocompression bonding such as heat treatment and pressure treatment is performed to the film and the subject. In the case of performing heat treatment and pressure treatment, an adhesive layer provided on the uppermost surface of the film or a layer (not an adhesive layer) provided on the outermost layer is melted by heat treatment to be attached by applying pressure.

The surface of the film may be provided with an adhesive layer or not. The adhesive layer corresponds to a layer containing an adhesive such as a thermosetting resin, a UV curing resin, or an epoxy resin-based adhesive. Silica coat is preferably used for a sheet material, and it is possible to use, for example, a sheet material where an adhesive layer, a film such as polyester, and silica coat are stacked.

The layer including the TFTs 701 and 702 may be separated from the substrate in any of the following methods: (1) A substrate with heat resistance of about 300 to 500° C. is used for the substrate, a metal oxide film is provided between the substrate and the insulating film 703, and the metal oxide film is weakened due to crystallization, thereby separating physically the layer including the TFTs 701 and 702; (2) An amorphous silicon film containing hydrogen is provided between the substrate and an insulating layer 703, and the amorphous silicon film is removed by laser irradiation or etching using a gas or a solution, thereby separating the layer including the TFTs 701 and 702; (3) The substrate over which the layer including the TFTs 701 and 702 is formed is removed mechanically or by etching using a solution, thereby detaching the layer including the TFTs 701 and 702; and (4) A peeling layer and a metal oxide film are provided between a highly heat resistant substrate and the insulating layer 703, the metal oxide film is weakened due to crystallization, part of the peeling layer is removed by etching using a solution or a gas such as $ClF_3$, and then the weakened metal oxide film is separated physically.

The anisotropic conductive adhesive 562 is, similarly to the anisotropic conductive adhesive 552, an adhesive where conductive particles 561 are dispersed. The layer including the TFTs 701 and 702 and the substrate 531 including the conductive film can be attached by compression bonding. Further, a region 724c that fills in the opening portion of the insulating films 703, 722, and 723 can be electrically connected to the connecting terminal 321a of the conductive film through the conductive particles 561.

Figure 5B:
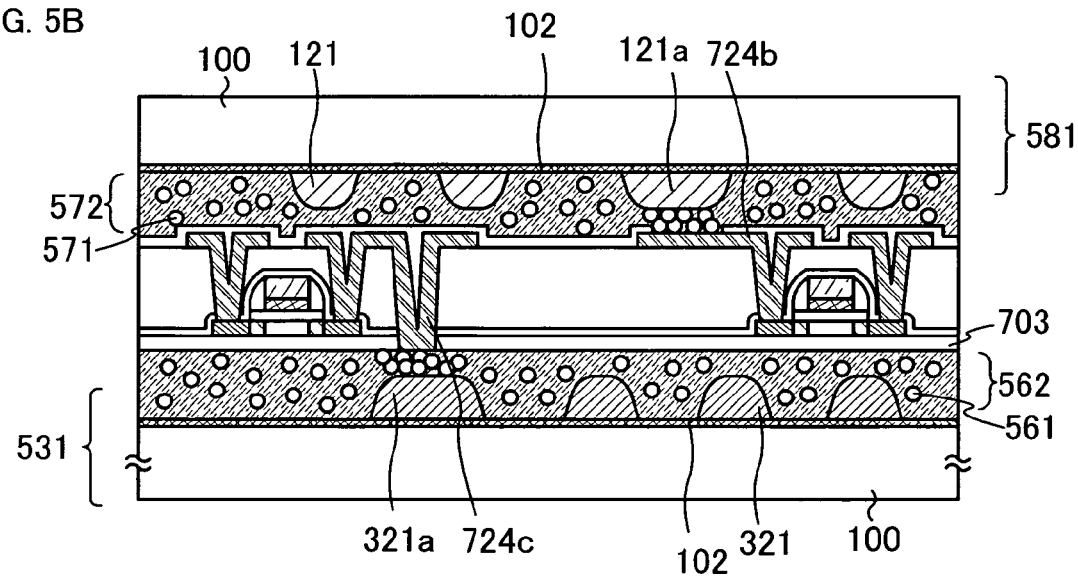

In addition, as well as the backside of the layer including TFTs 701 and 702, a substrate 581 having an antenna on the surface thereof may be attached to the surface with an anisotropic conductive adhesive 572 (refer to FIG. 5B). Typically, part of a source or drain electrode 724b of the TFT 702 may be exposed to be electrically connected to a connecting terminal 121a of a conductive film formed over the substrate 581 having an antenna with an anisotropic conductive particle 571.

When the separated layer including the TFTs 701 and 702 is attached to a flexible substrate or a film as described above, a semiconductor device that is reduced in thickness and weight, and is hardly broken even when dropped can be provided. In addition, since the flexible substrate has flexibility, the substrate can be attached to a curved surface or an irregular shape; thus various applications are achieved. When the substrate is reused, the semiconductor device can be reduced in cost.

When a plurality of antennas are provided, durability can be improved since even when one of the antennas is damaged, the other antennas can receive electromagnetic waves supplied from an external system. Further, when the plurality of antennas send and receive different frequency bands, a plurality of frequency bands can be received; therefore, more various kinds of reader/writers can be adopted.

In accordance with the above structures, a semiconductor device such as a wireless chip can be manufactured.

Embodiment 3

In the present Embodiment, steps of forming a conductive film pattern and a semiconductor device having the film pattern according to the present invention is described with the reference to FIGS. 6A to 6C and FIGS. 7A to 7H. The present embodiment is described by using a pixel electrode as the conductive film pattern and by using a light-emitting display device as the semiconductor device.

Figure 6A:
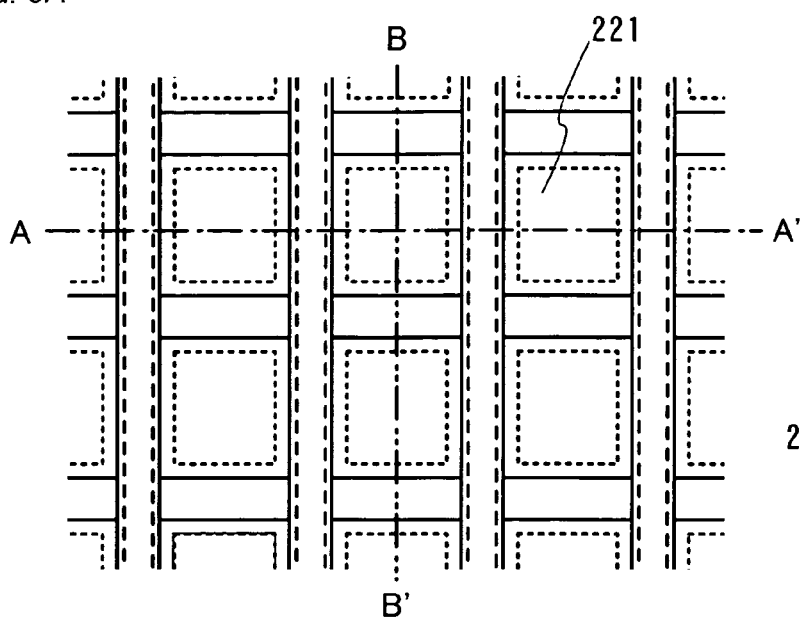
FIGS. 6A to 6C are a top view and cross-sectional views illustrating a structure of a semiconductor device according to the present invention.
Figure 6C:
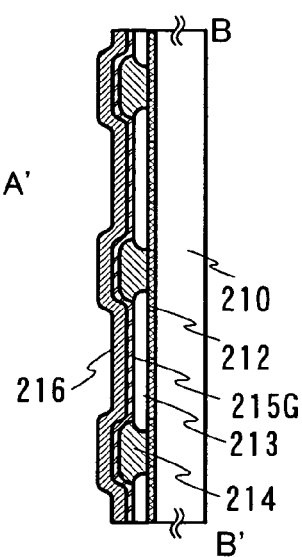
Figure 6B:
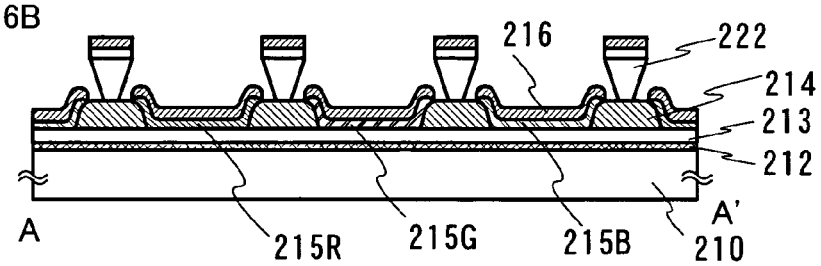
Figure 7A:
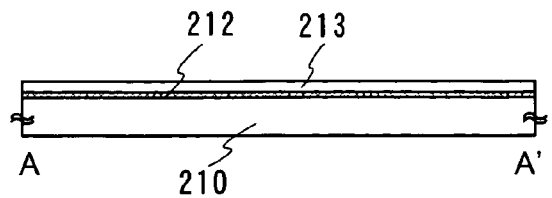
FIGS. 7A to 7H are cross-sectional views illustrating steps of manufacturing a semiconductor device according to the present invention.
Figure 7B:
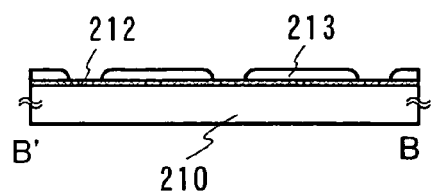
Figure 7C:
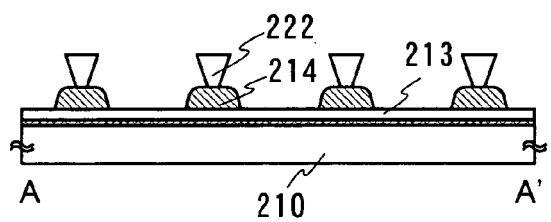
Figure 7D:
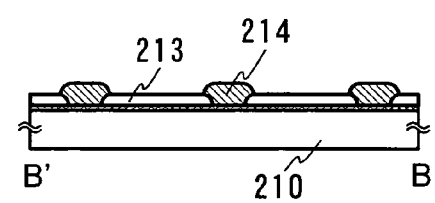
Figure 7E:
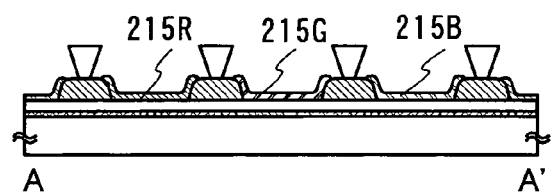
Figure 7F:
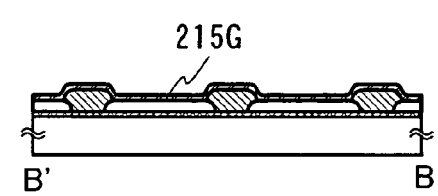
Figure 7G:
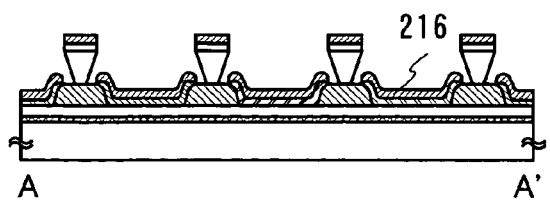
Figure 7H:
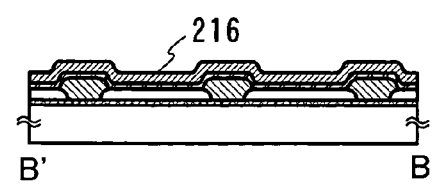

FIG. 6A shows a top view of a pixel portion before sealing. FIG. 6B shows a cross-sectional view taken along A-A' in FIG. 6A, and FIG. 6C shows a cross-sectional view taken along B-B' in FIG. 6A.

A film 212 including silicon, oxygen, and an inactive group is formed over a first substrate 210, and a plurality of first electrodes 213 are arranged in stripe shape with regular distances thereover. A partition wall 214 having an opening portion corresponding to each pixel is provided over each of the first electrodes 213. The partition wall 214 having an opening portion is made of a photosensitive or non-photosensitive organic material (polyimide, acrylic, polyamide, polyimide amide, resist, or benzocyclobutene), or an SOG film (for example, SiOx film containing an alkyl group). Further, black pigment or carbon black may be dispersed in the above material to make a partition have light blocking effect. In accordance with the light blocking effect, the partition wall 214 having an opening portion serves as a black matrix (BM). It is to be noted that the opening portion corresponding to each pixel serves as a light emitting region 221.

A plurality of partition walls 222 in a reverse tapered shape are provided in parallel over the partition wall 214 having an opening portion so as to intersect the first electrode 213. The partition wall 222 in a reverse tapered shape is formed by using a positive photosensitive resin so that a non-exposed area is remained as a pattern, and by adjusting exposure amount or developing time so that area under the pattern is etched more widely in accordance with a photolithographic method. The partition wall 222 in a reverse tapered shape may also be made of the above described material having light blocking effect to improve the contrast.

The height of each of the partition walls 222 in a reverse tapered shape is higher than the film thickness of layers 215R, 215G, and 215B containing an organic compound and a second electrode 216. Then, each of the layers 215R, 215G and 215B containing an organic compound and the second electrodes 216 are formed to be electrically isolated. The second electrodes 216 in the stripe shape are extended in parallel to the direction so as to intersect the first electrodes 213. It is to be noted that a film containing organic compound and a conductive film are also formed over the partition wall 222 in a reverse tapered shape.

In the present embodiment, the layers 215R, 215G, and 215B containing an organic compound are selectively formed to obtain a full color light emitting display device that can emit three kinds of lights (R, G and B). Each of the layers 215R, 215G, and 215B containing an organic compound, are formed in a parallel stripe pattern.

Alternatively, it is also possible to form a layer containing an organic compound over the entire surface and provide a monochrome light-emitting element, thereby obtaining a monochrome light-emitting display device or an area color light-emitting display device. Further alternatively, a white light-emitting device may be combined with a color filter to obtain a full color light-emitting display device. Since the partition wall 214 serves as a black matrix by being made of a material having light blocking effect, a color filter including only a colored layer can be used.

The light emitting element is sealed by attaching a second substrate with a sealant. A protective film to cover the second electrode 216 may be formed if necessary. It is preferable that the second substrate has a high barrier property against moisture. Further, if necessary, a drying agent may be disposed in a region surrounded by the sealant.

When the first electrode 213 is made of a light reflective conductive material, and the second electrode 216 is made of a light transmitting conductive material, a top emission type light-emitting device where light from the light-emitting element is transmitted through the second substrate can be obtained. When an aluminum alloy film containing carbon and nickel is used for the first electrode 213 in a single layer or a lower layer side of a stack, it is preferable that contact resistance with indium tin oxide (ITO), ITO containing silicon oxide, and an aluminum alloy containing carbon and nickel does not fluctuate highly because of energization or heat treatment.

When the first electrode 213 is made of a light transmitting conductive material and the second electrode 216 is made of a light reflective conductive material, a bottom emission type light-emitting device where light emission from the light-emitting element is extracted through the first substrate 210 can be obtained.

When the first electrode 213 and the second electrode 216 are both formed using a light transmitting conductive material, a light emitting device where light emission from the light-emitting element can be extracted through both of the first substrate and the second substrate can be obtained.

Next, a method for manufacturing the display device shown in FIGS. 6A to 6C will be described with the reference to FIGS. 7A to 7H.

Manufacturing steps of the region shown in FIG. 6B, are shown in FIGS. 7A, 7C, 7E, and 7G Manufacturing steps of the region shown in FIG. 6C, are shown in FIGS. 7B, 7D, 7F, and 7H.

Over a substrate 210, a film 212 in which silicon and oxygen are combined and an inactive group is combined with the silicon is formed. A composition containing zinc oxide and indium oxide is applied thereto by the screen printing method. Then, drying and baking are performed to form a first electrode 213 having a stripe shape (refer to FIGS. 7A and 7B).

Next, on the first electrode 213, partition walls 214 having opening portions corresponding to each pixel are formed. The partition walls can be formed with the use of the above materials by a known method such as the screen printing method, the applying method and etching. Here, a photosensitive or non-photosensitive organic material wherein dispersing black pigment or carbon black is dispersed, is printed, and then, dried and baked to form the partition walls 214 having opening portions.

A plurality of partition walls 222 having a reverse tapered shape are provided in parallel with each other over the partition walls 214 having opening portions so as to intersect with the first electrode 213. A positive photosensitive resin is applied to the partition walls 214 having opening portions, and dried and baked. Then, exposure and development is performed in accordance with the photolithographic method to form the partition walls having the reverse tapered shape, which are formed in non-exposed partitions. The reverse tapered shape can be obtained by controlling exposure dose or developing time so that a lower part of each partition wall is more etched. The partition walls 222 having the reverse tapered shape may also be formed using the above described material having a light blocking property to improve the contrast (refer to FIGS. 7C and 7D).

Then, layers 215R, 215G, and 215B containing an organic compound are selectively formed. Each of the layers 215R, 215G, and 215B containing an organic compound is formed in a parallel stripe pattern. Accordingly, it is possible to obtain a full color light emitting display device that can emit three kinds of light (R, G, and B).

Next, a second electrode 216 is formed. As the second electrode, a reflective conductive layer is formed by a known method such as sputtering or evaporation. It is to be noted that each of pixels is divided by the partition walls 222 having the reverse tapered shape. Therefore, head portions of the partition walls 222 having the reverse tapered shape prevent the layers 215R, 215G, and 215B containing an organic compound, and the second electrode 216 from being formed. Accordingly, the layers containing an organic compound and the second electrode can be divided for each partition wall 222 having the reverse tapered shape without using the known photolithographic method.

Then, the display device can be formed by sealing the substrate 210 with an opposite substrate. A top view of the display device mounted with an FPC and the like after sealing is shown in FIG. 13.

The display device according to the present specification includes a module where a display device is provided with a connector, for example an FPC (Flexible Printed Circuit), a TAB (Tape Automated Bonding) tape and a TCP (Tape Carrier Package), a module where a printed wiring board is attached to the end of a TAB tape or a TCP, and a module where an IC (Integrated Circuit) is directly mounted on a display element by COG (Chip On Glass).

A substrate 301 and an opposite substrate 310 are attached with a sealant 311 so as to face each other. The sealant 311 may be formed by using a photo curable resin, and more preferably, a material with little degasification and low hygroscopicity. Further, the sealant 311 may be added with a filler (a stick or fiber spacer) or a spherical spacer in order to keep the distance between the substrates constant. The substrate 310 is preferably formed using a material having the same thermal expansion coefficient as the substrate 301, and glass (including quartz glass) or plastic can be employed.

Figure 13:
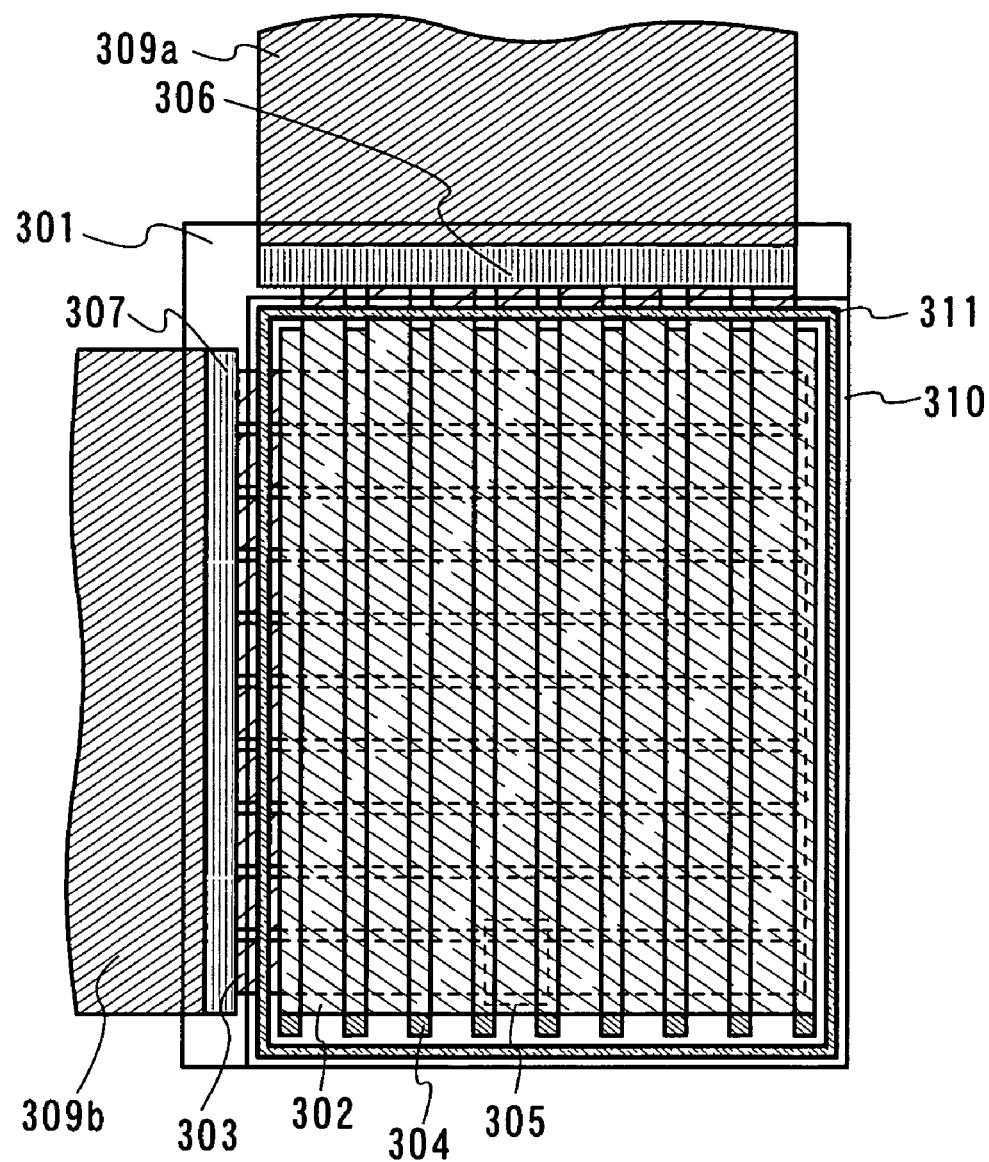
FIG. 13 is a top view illustrating a structure of a semiconductor device according to the present invention.

As shown in FIG. 13, a pixel portion constituting the display image has scanning lines and data lines that perpendicularly intersect each other.

The first electrode 213 in FIG. 6 corresponds to a data line 303 in FIG. 13, the second electrode 216 corresponds to a scanning line 302, and the partition wall 222 having a reverse tapered shape corresponds to a partition wall 304. A layer containing an organic compound is interposed between the data line 303 and the scanning line 302, and an intersection denoted as 305 corresponds to one pixel.

The wiring end of the data line 303 is electrically connected to an input terminal 307, and then connected to an FPC 309b through the input terminal 307. The scanning line 302 is electrically connected to an FPC 309a through an input terminal 306.

If necessary, an optical film such as a polarizing plate, a circular polarizing plate (including an elliptic polarizing plate), a wave plate (a λ/4 plate, a λ/2 plate), and a color filter may be appropriately provided on the emission surface. Further, an antireflection film may be provided on the polarizing plate or the circular polarizing plate. For example, an antiglare treatment may be performed to reduce reflected glare by diffusing reflected light due to the unevenness of the surface. Alternatively, an antireflection treatment for heating the polarizing plate or the circular polarizing plate may be performed as well. A hard coat treatment is preferably performed thereafter in order to protect the polarizing plate or the circular polarizing plate from external impact. However, the polarizing plate or the circular polarizing plate decreases light extraction efficiency, and the polarizing plate or the circular polarizing plate itself is expensive and degrades easily.

In accordance with the above processes, it is possible to form the pixel electrode and the light-emitting display device.

Embodiment 4

Figure 8A:
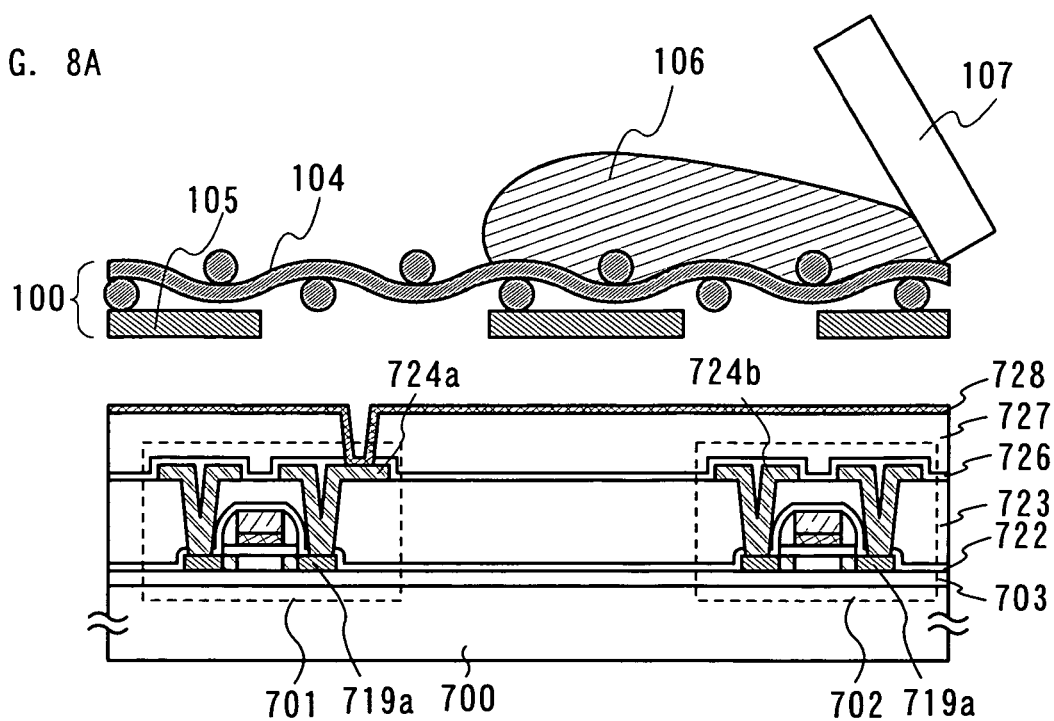
FIGS. 8A to 8C are cross-sectional views illustrating steps of manufacturing a semiconductor device according to the present invention.
Figure 8B:
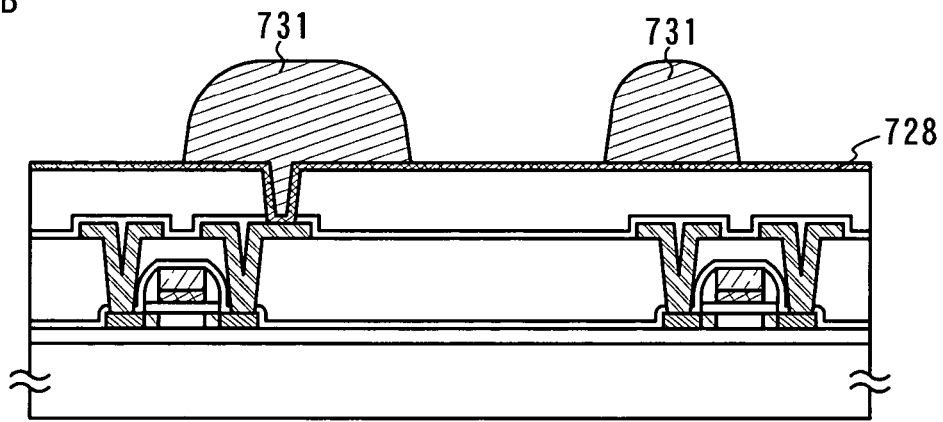
Figure 8C:
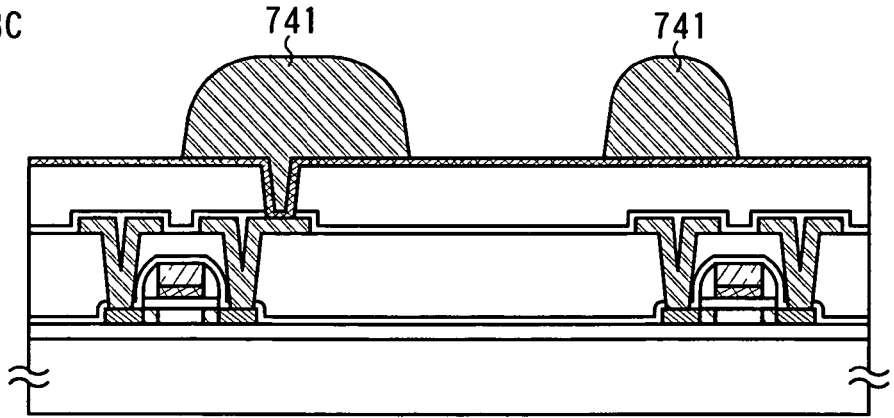

In the present embodiment, a method for manufacturing a semiconductor device that has a conductive film connected to a TFT will be described with the reference to FIGS. 8A to 8C. A layer including a plurality of TFTs is provided over a substrate 700. As these TFTs, p-channel type TFTs and n-channel type TFTs can be appropriately combined. In the present embodiment, n-channel type TFTs are employed.

TFTs 701 and 702 are provided over an insulating film 703 formed over the substrate 700. An insulating film 723 is provided so as to cover the TFTs 701 and 702 and an insulating film 722 serving as a passivation film. The insulating film 723 is provided to level the surface. Conductive films 724a and 724b serving as a source wiring or a drain wiring are connected to a source region and a drain region 719a and 719b. The conductive films 724a and 724b fill in contact holes provided in the insulating film 723.

In addition, insulating films 726 and 727 are provided so as to cover the conductive films 724a and 724b. These insulating films 726 and 727 are provided to level the surface and to protect the TFTs 701 and 702 and the conductive films 724a and 724b.

After forming the insulating films 726 and 727, an opening portion is provided in a part of the insulating films 726 and 727 to expose the conductive film 724a. Next, a film 728 in which silicon and oxygen are combined and an inactive group is combined with the silicon, is formed. Here, the same material of the film 102 in which silicon and oxygen are combined and an inactive group is combined with the inactive group, described in Embodiment Mode can be appropriately used for the film 728 in which silicon and oxygen are combined and an inactive group is combined with the silicon (refer to FIG. 8A).

Next, a conductive composition is applied with the use of the screen printing method over the film 728 in which silicon and oxygen are combined and an inactive group is combined with the silicon that is formed on the opening portion. As a result, conductive composition 731 that has a desired shape is applied over the film 728 in which silicon and oxygen are combined and an inactive group is combined with the silicon. The conductive composition described in the embodiment mode can be appropriately used for the conductive composition 731 (refer to FIG. 8B).

In accordance with the above steps, a conductive film 741 connected to the TFT can be formed by drying and baking the conductive composition that has a desired shape. It is to be noted that the conductive film 741 serves as a connecting terminal, a wiring, and an antenna.

Embodiment 5

Figure 9A:
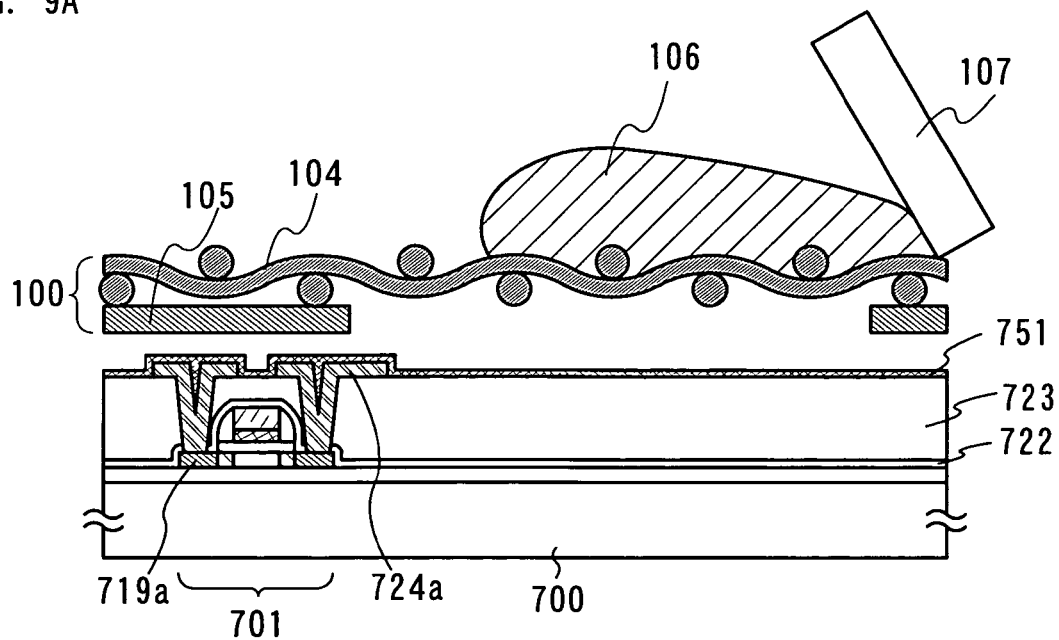
FIGS. 9A to 9C are cross-sectional views illustrating steps of manufacturing a semiconductor device according to the present invention.

In the present embodiment, a method for manufacturing a semiconductor device that has a conductive film connected to a TFT will be described with the reference to FIGS. 9A to 9C. In the present embodiment, a pixel electrode is formed as the conductive film formed by the screen printing method, and a liquid crystal display device is formed as the semiconductor device.

As same as Embodiment 4, a TFT 701 is formed over a substrate 700, and insulating films 722 and 723 are formed to cover the TFT 701. The insulating films 722 and 723 are partly etched to provide opening portions, and then conductive films 724a connecting to a source region and a drain region 719a are formed.

Next, a film 751 in which silicon and oxygen are combined and an inactive group is combined with the silicon, is formed over the insulating film 723 and the conductive films 724a.

Figure 9B:
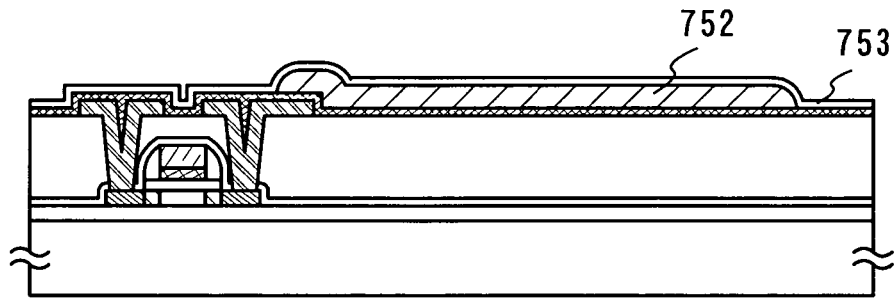
Figure 9C:
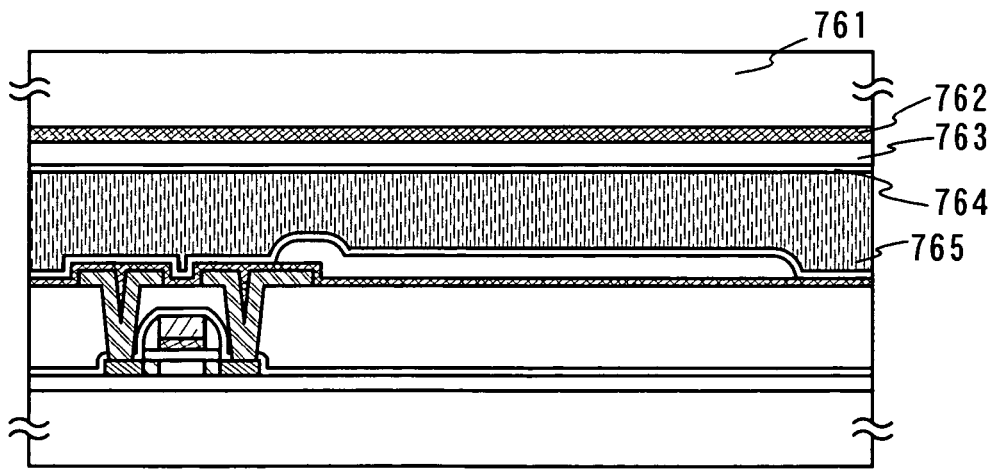

Then, a first pixel electrode 752 is printed over the film 751 in which silicon and oxygen are combined and an inactive group is combined with the silicon by the screen printing method as same as embodiment mode (refer to FIG. 9B).

A composition containing indium tin oxide (ITO), zinc oxide (ZnO), indium zinc oxide (IZO), gallium-doped zinc oxide (GZO), indium tin oxide containing silicon oxide, and the like is printed and baked to form a pixel electrode having a light transmitting property. By using such a pixel electrode, a transmitting liquid crystal display can be manufactured.

Further, a composition mainly containing metal particles such as Ag (silver), Au (gold), Cu (copper), W (tungsten), and Al (aluminum) is printed and baked to form a pixel electrode having reflectivity. By using such a pixel electrode, a reflective liquid crystal display device can be manufactured.

Furthermore, a semi-transmissive liquid crystal display device can be manufactured by providing the above transmitting pixel electrode and the above reflective pixel electrode each one pixel.

In accordance with the above steps, an active matrix substrate can be formed.

Next, an insulating film is formed by the printing method or spin coat method, and an oriented film 753 is formed by a rubbing treatment. It is to be noted that the oriented film 753 can be formed by oblique evaporation.

Although it is not illustrated, a sealant having a closed loop shape is formed by the droplet discharging method on the peripheral region of the pixel portion in an opposing substrate 761 provided with a oriented film 764, a second electrode (opposing electrode) 763, and a colored layer 762. The sealant may be mixed with filler, and the opposing substrate 761 may be provided with a color filter and a shielding film (black matrix).

Next, a liquid crystal material is dropped to the inside of the closed loop made of the sealant by dispenser technique (dropping technique). Then, the opposing substrate and the active matrix substrate are attached in vacuum, and a liquid crystal layer 765 filled with the liquid crystal material is formed by using ultraviolet curing. It is to be noted that a dip technique (pumping technique) in which the liquid crystal material is injected by using a capillary phenomenon after attaching the opposing substrate to the substrate, can be used for the method for forming the liquid crystal layer 765 instead of the dispenser technique (dropping technique).

Then, a wiring substrate, typically an FPC (Flexible Printed Circuit), is attached to connecting terminal portions of a scanning line and a signal line with a connecting conductive layer interposed therebetween. In accordance with the above steps, the liquid crystal display device can be formed.

It is to be noted that a protective circuit for preventing electrostatic discharge failure, typically a diode or the like, may be provided between the connecting terminal and a source wiring (or gate wiring), or in the pixel portion. In this case, the protective circuit is manufactured through the same steps as the above described TFT. The electrostatic discharge can be prevented by connecting a gate wiring layer of the pixel portion and a drain or a source wiring layer of the diode.

Embodiment 6

In the present embodiment, a method for manufacturing a semiconductor will be described with reference to the drawings.

Figure 10A:
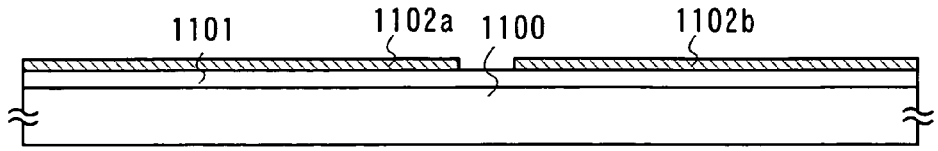
FIGS. 10A to 10E are cross-sectional views illustrating steps of manufacturing a semiconductor device according to the present invention.

Over a surface of a substrate 1100, an insulating film 1001, and peeling layers 1102a and 1102b are formed (refer to FIG. 10A).

The substrate 1100 may be a glass substrate, a quartz substrate, a metal substrate, a stainless steel substrate having a surface where an insulating film is formed, or the like. The above substrate 1100 has no limit in terms of shape and size. Accordingly, for example, if a rectangular substrate with a side of one meter or more is used for the substrate 1100, productivity can be dramatically increased. This is a major advantage as compared to the case of using a circular silicon substrate.

After forming the insulating film 1001 over the substrate 1100, a resist mask is formed by photolithographic method, then, a conductive layer is selectively etched by using the resist mask to form the peeling layers 1102a and 1102b. In order to obtain the peeling layers 1102a and 1102b, a single layer or stacked layers are formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), an alloy material mainly containing the elements, or a compound material mainly containing the elements. The layer containing silicon may have any of an amorphous structure, a microcrystalline structure, and a polycrystalline structure.

When each of the peeling layers 1102a and 1102b has a single layer structure, it is preferable to form a tungsten layer, a molybdenum layer, or a layer containing a mixture of tungsten and molybdenum. Instead, a layer containing an oxide or an oxynitride of tungsten, a layer containing an oxide or an oxynitride of molybdenum, or a layer containing an oxide or an oxynitride of a mixture of tungsten and molybdenum may be formed. It is to be noted that as the mixture of tungsten and molybdenum, for example, an alloy of tungsten and molybdenum can be cited.

When each of the peeling layers 1102a and 1102b has a stacked layer structure, it is preferable that a tungsten layer, a molybdenum layer, or a layer containing a mixture of tungsten and molybdenum be formed as the first layer, and a layer containing an oxide, a nitride, an oxynitride, or a nitride oxide of tungsten, molybdenum, or a mixture of tungsten and molybdenum be formed as the second layer.

When each of the peeling layers 1102a and 1102b has a stacked layer structure of a layer containing tungsten and a layer containing an oxide of tungsten, a layer containing a silicon oxide may be formed on a layer containing tungsten, thereby forming a layer containing an oxide of tungsten on an interface between the tungsten layer and the silicon oxide layer. Further, the surface of the layer containing tungsten may be subjected to a thermal oxidation treatment, an oxygen plasma treatment, an $N_2O$ plasma treatment, or a treatment using a strong oxidizing solution such as ozone water to form a layer containing an oxide of tungsten. The same method applies to the case of forming a layer containing a nitride, an oxynitride and a nitride oxide of tungsten. After forming a layer containing tungsten, a silicon nitride layer, a silicon oxynitride layer, and a silicon nitride oxide layer may be formed thereover.

The oxide of tungsten is represented by $WO_x$, where x is in the range of $2 \leq x \leq 3$. There are cases where x is 2 ($WO_2$), 2.5 ($W_2O_5$), 2.75 ($W_4O_{11}$), 3 ($WO_3$), or the like.

In accordance with the above steps, the insulating film 1001 is formed between the substrate 1100 and the peeling layers 1102a and 1102b. However, the present invention is not limited to these steps. The peeling layers 1102a and 1102b may be formed in contact with the substrate 1100.

In the present embodiment, a glass substrate is used for the substrate 1100, a silicon oxynitride film with a thickness of 100 nm is formed for the insulating film 1101 by the CVD method, and a tungsten layer with a thickness of 30 nm is formed for the peeling layer 1102a and 1102b by sputtering.

Figure 10B:
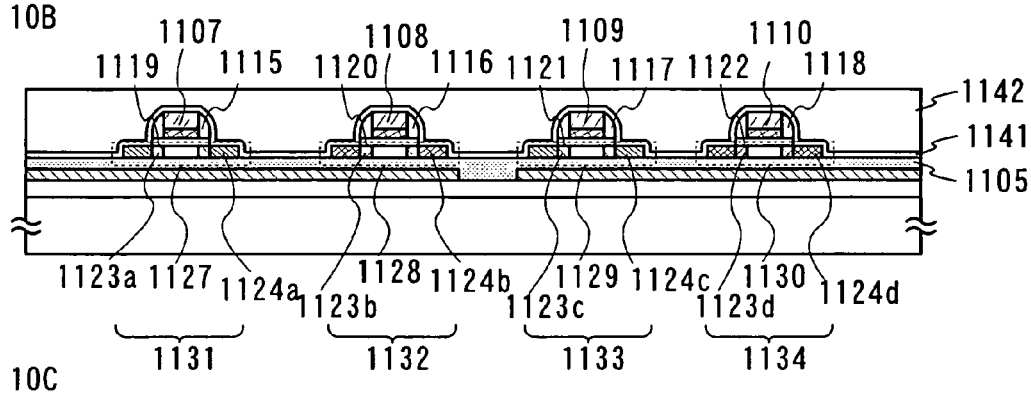

Next, as shown in FIG. 10B, an insulating film 1105 is formed as a base film to cover the peeling layers 1102a and 1102b. In order to obtain the insulating film 1105, a single layer or stacked layers are formed of a silicon oxide film, a silicon nitride film, or a silicon oxynitride film by a known method (sputtering, a plasma CVD method or the like). The insulating film as a base film severs as a blocking layer that prevents the invasion of impurities from the substrate 1100.

In the present embodiment, a silicon oxide film with a thickness of 200 nm is formed by sputtering for the insulating film 1105 as a base film.

Next, an amorphous semiconductor film (for example, a film containing amorphous silicon) is formed over the insulating film 1105. Then, the amorphous semiconductor film is crystallized by a known crystallization method (laser crystallization, thermal crystallization using RTA or an annealing furnace, thermal crystallization using a metal element that accelerates crystallization, a method combining thermal crystallization and laser crystallization using a metal element that accelerates crystallization, or the like) to form a crystalline semiconductor film. After that, the obtained crystalline semiconductor film is etched to have a desired shape to form crystalline semiconductor films 1127 to 1130.

Manufacturing steps of the crystalline semiconductor films 1127 to 1130 will be described specifically. First, an amorphous semiconductor film with a thickness of 66 nm is formed by the plasma CVD method. After the amorphous semiconductor film is applied with a solution containing nickel that is a metal element for accelerating crystallization, the amorphous semiconductor layer is subjected to a dehydrogenation treatment (at 500° C. for one hour) and a thermal crystallization treatment (at 550° C. for four hours), thereby forming a crystalline semiconductor film. Then, the crystalline semiconductor film is irradiated with laser light of continuous oscillation or pulsed oscillation, and selectively etched using a resist mask that is formed by the photolithographic method, so that the crystalline semiconductor films 1127 to 1130 are formed.

Further, an amorphous semiconductor film serving as a gettering site may be formed over the crystalline semiconductor film. The amorphous semiconductor film serving as the gettering site is required to contain an impurity element such as phosphorus and argon, and therefore, the amorphous semiconductor film is preferably formed to be capable of containing argon at a high concentration by sputtering. Then, a metal element is diffused in the amorphous semiconductor film by a heat treatment (such as the RTA method and thermal anneal using an annealing furnace), and the amorphous semiconductor film containing the metal element is removed. As a result, the content of the metal element in the crystalline semiconductor films can be reduced or removed.

Next, an insulating film is formed to cover the crystalline semiconductor films 1127 to 1130. In order to obtain the insulating film, a single layer or stacked layers are formed of a silicon oxide film, a silicon nitride film, or a silicon oxynitride film by the plasma CVD method or sputtering.

In the present embodiment, a silicon oxynitride film is formed as the insulating film by the CVD method.

Next, a first conductive film and a second conductive film are stacked over the insulating film. The first conductive film is formed to have a thickness of 20 to 100 nm by the known method (the plasma CVD method or sputtering). The second conductive film is formed to have a thickness of 100 to 400 nm by the known method. The first conductive film and the second conductive film are formed of an element selected from tantalum (Ta), tungsten (W), titanium (Ti), molybdenum (Mo), aluminum (Al), copper (Cu), chromium (Cr), niobium (Nb), and the like, or an alloy material or a compound material mainly containing these elements. Alternatively, the first and second conductive films may be formed of a semiconductor material doped with an impurity element such as phosphorus, typically such as polycrystalline silicon.

The first conductive film and the second conductive film are formed by combining, for example, a tantalum nitride (TaN) layer and a tungsten (W) layer, a tungsten nitride (WN) layer and a tungsten layer, a molybdenum nitride (MoN) layer and a molybdenum (Mo) layer, and the like. When the first conductive film and the second conductive film are formed of tungsten and tantalum nitride that have high heat resistance, a heat treatment for thermal activation can be performed.

In the present embodiment, a tantalum nitride layer with a thickness of 30 nm is formed for the first conductive film, and a tungsten layer with a thickness of 370 nm is formed for the second conductive film.

Next, a resist mask is formed by the photolithographic method, and etching is performed to form gate electrodes, thereby forming conductive films (also referred to as gate electrodes) 1107 to 1110 serving as gate electrodes.

Next, an impurity element that imparts n-type conductivity is added to the crystalline semiconductor films 1127 to 1130 at a low concentration by ion doping or ion implantation, thereby forming n-type impurity regions and p-type impurity regions.

Then, an insulating film is formed to cover the insulating film and the conductive films 1107 to 1110. In order to obtain the insulating film, a single layer or stacked layers is/are formed of a film (also referred to as an inorganic film) containing an inorganic material such as silicon, an oxide of silicon or a nitride of silicon, or a film (also referred to as an organic film) containing an organic material such as an organic resin by the known method (such as the plasma CVD method and sputtering).

In the present embodiment, a silicon oxynitride film is formed for the insulating film by the CVD method.

Then, the insulating film is selectively etched by anisotropic etching that is an etching mainly in the perpendicular direction, so that insulating films (hereinafter, referred to as sidewall insulating films) 1115 to 1118 are formed in contact with the side walls of the conductive films 1107 to 1110. The sidewall insulating films 1115 to 1118 are used as masks for doping to form a source region and a drain region.

In accordance with the etching step for forming the sidewall insulating films 1115 to 1118, the insulating film is also etched to form gate insulating films 1119 to 1122. The gate insulating films 1119 to 1122 overlap with the conductive films 1107 to 1110 and the sidewall insulating films 1115 to 1118. When the etching rate of the material of the gate insulating films are equal to that of the sidewall insulating films 1115 to 1118, the gate insulating films are etched as shown in FIG. 10B. Accordingly, when the etching rate of the material of the gate insulating films are different form that of the sidewall insulating films 1115 to 1118, the gate insulating films may remain even after the etching step is performed to form the sidewall insulating films 1115 to 1118.

Subsequently, an impurity element that imparts n-type conductivity is added to the crystalline semiconductor films 1127 and 1129 using the sidewall insulating films 1115 and 1117 as masks, thereby forming first n-type impurity regions (also called LDD regions) 1123a and 1123c and second n-type impurity regions (also called a source region and a drain region) 1124a and 1124c.

Further, an impurity element that imparts p-type conductivity is added to the crystalline semiconductor films 1128 and 1130, thereby forming first p-type impurity regions (also called LDD region) 1123b and 1123d and second p-type impurity regions (also called a source region and a drain region) 1124b and 1124d.

The concentration of the impurity element contained in the first n-type impurity regions 1123a and 1123c is lower than that of the impurity element contained in the second n-type impurity regions 1124a and 1124c. Similarly, the concentration of the impurity element contained in the first p-type impurity regions 1123b and 1123d is lower than that of the impurity element contained in the second p-type impurity regions 1124b and 1124d.

Through the above steps, n-type thin film transistors 1131 and 1133 are completed. Further, p-type thin film transistors 1132 and 1134 are completed.

Each of the n-type thin film transistors 1131 and 1133 has an LDD structure, and includes an active layer having a first n-type impurity region, a second n-type impurity region and a channel forming region, a gate insulating film, and a conductive film serving as a gate electrode. Each of the p-type thin film transistors 1132 and 1134 has an LDD structure, and includes an active layer having a first n-type impurity region, a second n-type impurity region and a channel forming region, a gate insulating film, and a conducive film serving as a gate electrode.

Next, an insulating film is formed of a single layer or stacked layers to cover the thin film transistors 1131 to 1134. In the present embodiment, the case where two insulating films are stacked to cover the thin film transistors 1131 to 1134 is shown. For a first insulating film 1141, a film with a thickness of 50 nm containing silicon oxynitride is formed, and for a second insulating film 1142, a film with a thickness of 600 nm containing silicon oxide is formed.

Before forming the insulating films 1141 and 1142, or after forming one or both of the insulating films 1141 and 1142, a heat treatment is preferably performed for recovery of the crystallinity of the semiconductor films, activation of impurity elements added to the semiconductor films, and hydrogenation of the semiconductor films. As the heat treatment, thermal anneal, laser anneal, RTA or the like may be adopted.

Figure 10C:
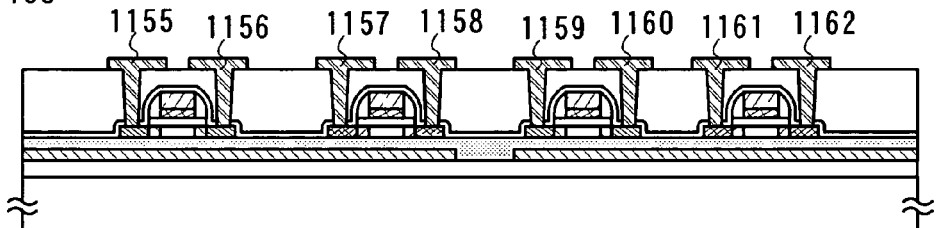

Next, the insulating films 1141 and 1142 are etched by the photolithographic method, thereby forming contact holes to expose the n-type impurity regions 1124a and 1124c, and the p-type impurity regions 1124b and 1124d (refer to FIG. 10C).

Then, a conductive film is formed to fill in the contact holes, and patterned to form conductive films 1155 to 1162. The conductive films 1155 to 1162 serve as source wirings or drain wirings of the TFTs.

In order to obtain the conductive films 1155 to 1162, a single layer or stacked layers is/are formed of at least one element selected form titanium (Ti), aluminum (Al), and neodymium (Nd), or an alloy material or a compound material mainly containing these elements by the known method (such as the plasma CVD method and sputtering). The alloy material mainly containing aluminum corresponds, for example, to a material that mainly contains aluminum and contains nickel, or an alloy material that mainly contains aluminum and contains nickel and one or both of carbon and silicon.

In the present embodiment, a titanium layer with a thickness of 60 nm, a titanium nitride layer with a thickness of 40 nm, an aluminum layer with a thickness of 500 nm, a titanium layer with a thickness of 60 nm, and a titanium nitride layer with a thickness of 40 nm are stacked in this order from the insulating film 1142 side by sputtering for the conductive films 1155 to 1162.

Figure 10D:
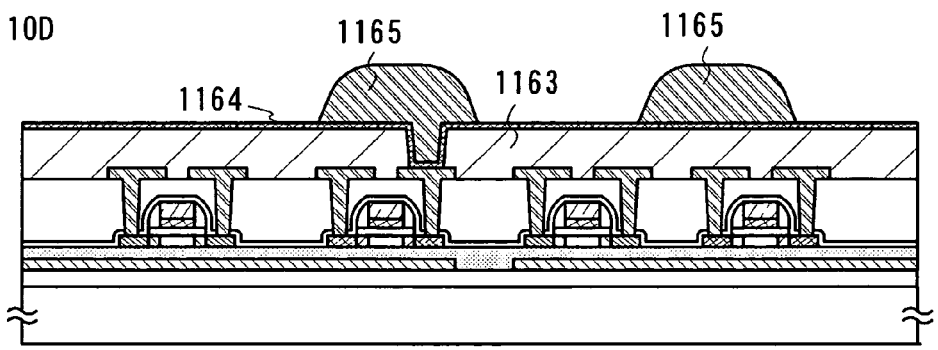

Next, an insulating film 1163 is formed of a single layer or stacked layers to cover the conductive films 1155 to 1162 (refer to FIG. 10D). The film 1163 that covers the conductive films 1155 to 1162 is formed of an inorganic insulating film. For the inorganic insulating film, siloxane polymer with a thickness of 1.5 μm is applied, and then dried and baked to form the insulating film 1163.

Similarly to the insulating film 1142 that covers the thin film transistors, contact holes are formed in the insulating film 1163 that covers conductive films 1155 to 1162, and a film 1164 in which silicon and oxygen are combined and an inactive group is combined with the silicon is formed. In the present embodiment, FAS is chemically adsorbed to the insulating film 1163, thereby forming the film 1164 in which silicon and oxygen are combined and an inactive group is combined with the silicon that is formed of a monomolecular, is formed.

Then, a conductive composition is printed over the film 1164 in which silicon and oxygen are combined and an inactive group is combined with the silicon by the screen printing method, and drying and baking are performed to form a conductive film 1165 with a thickness of 5 to 40 μm. The conductive film 1165 serves as a part of an antenna.

In the present embodiment, an Ag paste is used for the conductive film 1165. In accordance with the above steps, the conductive film 1165 that serves as an antenna connecting to the TFT, can be formed.

A protective film made of a carbon such as DLC (Diamond Like Carbon), silicon nitride, and silicon nitride oxide may be formed over the film 1164 in which silicon and oxygen are combined and an inactive group is combined with the silicon, and the conductive film 1165 that serves as an antenna.

Figure 10E:
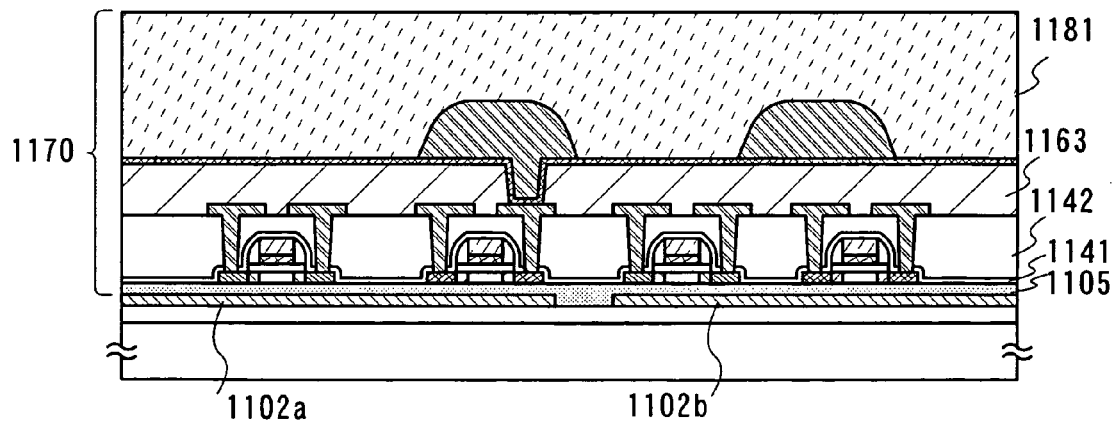

Next, an insulating film 1181 is formed over the film 1164 in which silicon and oxygen are combined and an inactive group is combined with the silicon, and the conductive film 1165. The insulating film 1181 is preferably a panelized film since the insulating film 1181 is provided as a protective film in subsequent separation steps (refer to FIG. 10E).

In the present embodiment, an epoxy resin layer with a thickness of 15 μm is formed by the screen printing method for the insulating film 1181. It is to be noted that, hereinafter, the stacked layers from the insulating film 1105 to the insulating film 1181 are denoted as a layer 1170 including a plurality of thin film transistors.

Then, opening portions 1182 are formed to expose the peeling layers 1102a and 1102b. The opening portions 1182 are formed by removing a part of the insulating films 1105, 1141, 1142, 1163, and 1181 with the use of the laser ablation method or the photolithographic method.

Figure 11A:
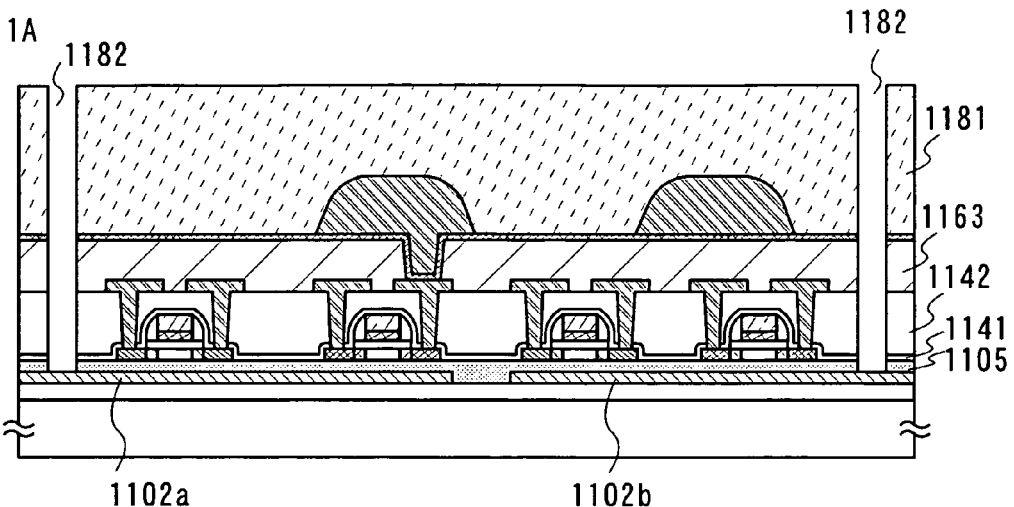
FIGS. 11A to 11C are cross-sectional views illustrating steps of manufacturing a semiconductor device according to the present invention.

In the present embodiment, the opening portions 1182 are formed by irradiating with laser beams from a UV laser (refer to FIG. 11A).

Figure 11B:
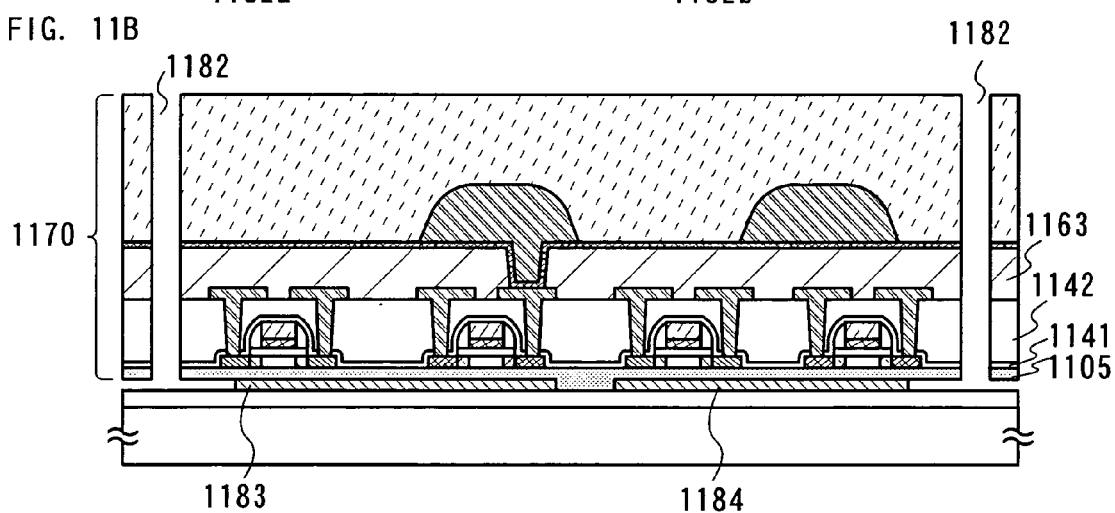

An etching agent is introduced into the opening portions 1182, thereby removing a part of the peeling layers 1102a and 1102b (refer to FIG. 11B). The peeling layers that are partially etched, are denoted as remaining peeling layers 1183 and 1184. In the case of wet etching, a mixed solution obtained by diluting hydrofluoric acid with water or ammonium fluoride, a mixed solution of hydrofluoric acid and nitric acid, a mixed solution of hydrofluoric acid, nitric acid and acetic acid, a mixed solution of hydrogen peroxide and sulfuric acid, a mixed solution of hydrogen peroxide, ammonia water and water, a mixed solution of hydrogen peroxide, hydrochloric acid and water, and the like are used as the etching agent. Further, in the case of dry etching, a gas containing halogen-based atoms or molecules such as fluorine or a gas containing oxygen is employed. A gas or a solution containing halogen fluoride or a halogen compound is preferably used as the etching agent.

In the present embodiment, a part of the peeling layers is etched with the use of chlorine trifluoride ($ClF_3$). The peeling layers that are partially etched are denoted as the remaining peeling layers 1183 and 1184.

Figure 11C:
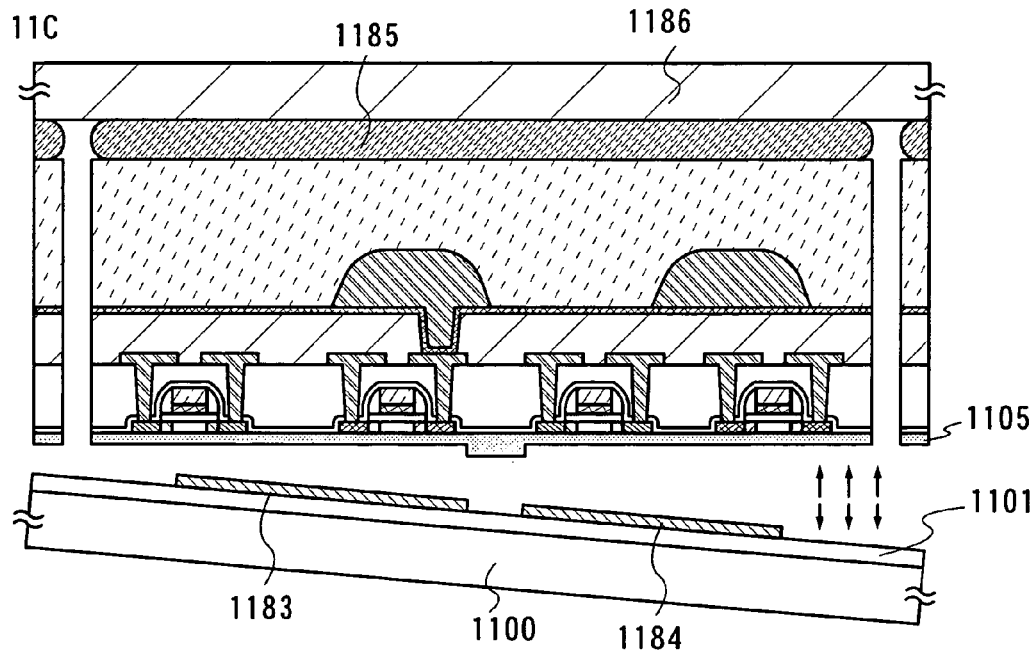

Next, the surface of the insulating film 1181 is attached to a base material 1186 with an adhesive 1185, and the substrate 1100 and the peeling layers 1102*a* and 1102*b* are separated from the layer 1170 including a plurality of thin transistors (refer to FIG. 11*c*).

In the present embodiment, a transposing roller provided with a low adhesive film is used as the base material 1186 and turned while applying the adhesive 1185 to the insulating layer 1181, so that only the layer 1170 including the plurality of transistors, which is provided over the insulating film 1105, is transposed onto the base material 1186. The transposing roller may be formed of a silicone-based resin or a fluorine-based resin.

At this time, the adhesive strength between the base material 1186 and the layer 1170 including a plurality of transistors is set higher than that between the substrate 1100 and the insulating film 1105. Then, only the layer including a plurality of transistors, which is provided over the insulating film 1105, is separated from the substrate.

Next, the base material 1186 is separated from the layer 1170 including a plurality of thin film transistors.

Figure 12A:
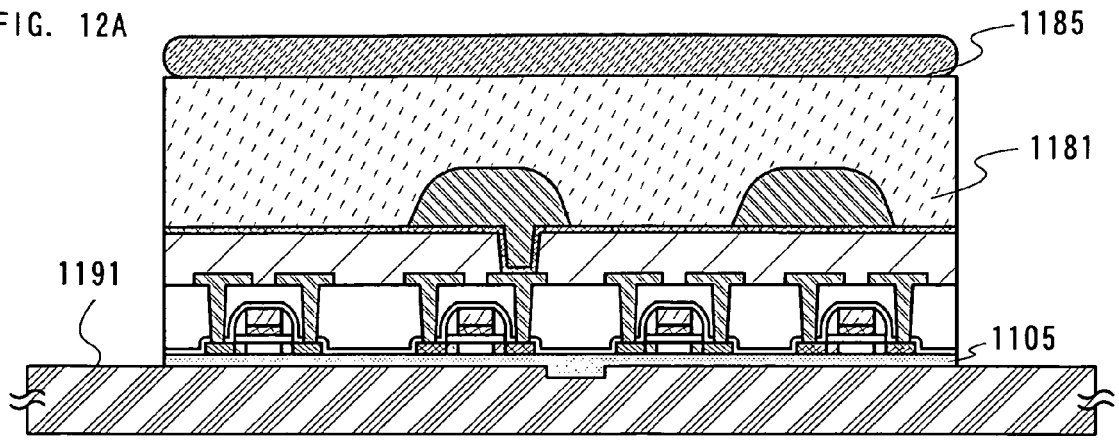
FIGS. 12A to 12 C are cross-sectional views illustrating steps of manufacturing a semiconductor device according to the present invention.

Then, a film 1191 is attached to the insulating film 1105 (refer to FIG. 12A). The base material 750 disclosed in Embodiment 2 can be appropriately used for the film 1191. When a sheet material in which an adhesive layer, a PET film, and silica coat are stacked is used for the film 1191, moisture and the like can be prevented from entering the inside after sealing.

Figure 12B:
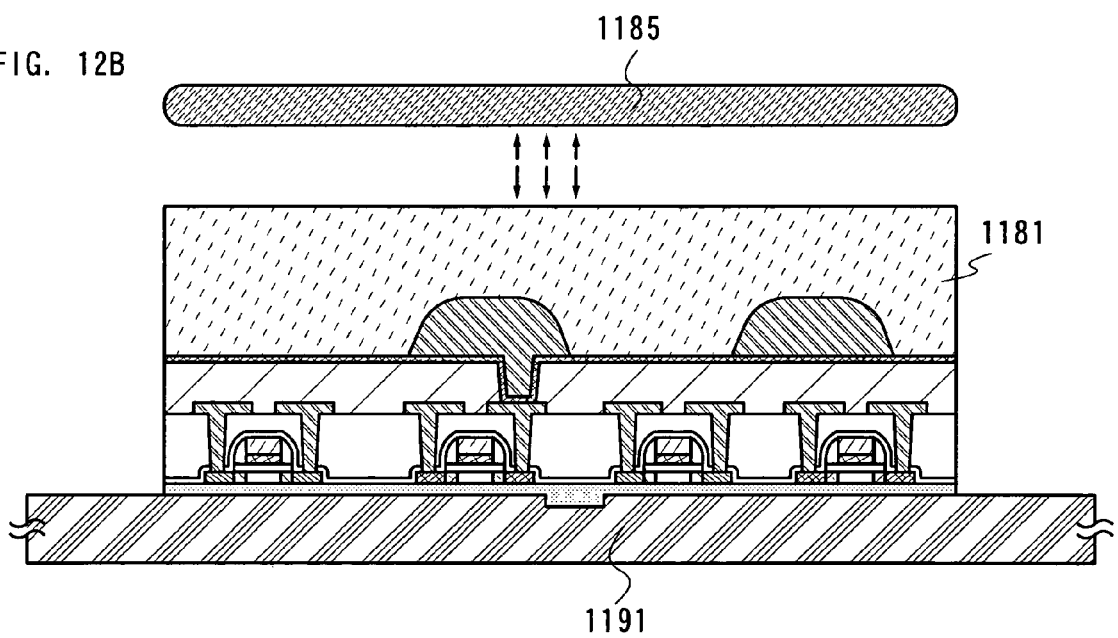

Next, the adhesive 1185 is removed from the insulating film 1181 (refer to FIG. 12B).

In the present embodiment, the adhesive 1185 is removed by irradiating with a UV ray.

Figure 12C:
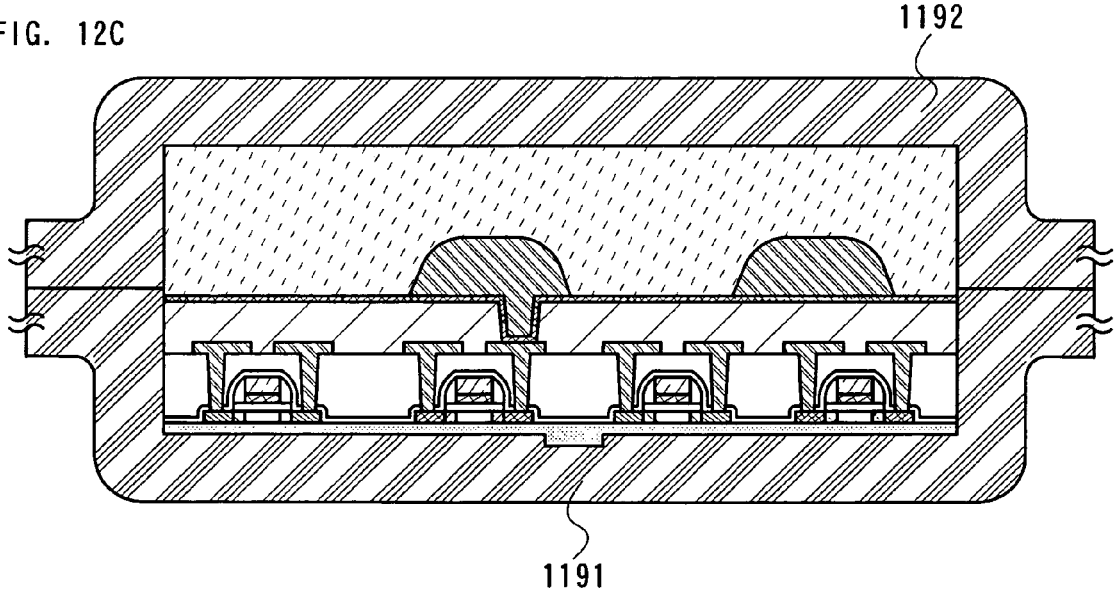

Next, a film 1192 is attached to the surface of the layer 1170 including a plurality of transistors and the film 1191 to seal the layer 1170 including a plurality of transistors (refer to FIG. 12C). The same material as the film 1191 can be also used for the film 1192, appropriately.

In the present embodiment, a sheet material in which an adhesive layer, a PET film, and silica coat are stacked is used for the film 1192.

Then, in an adhesive region of the films 1191 and 1192, the layer including a plurality of transistors is cut off individually. Accordingly, wireless chips can be formed.

Embodiment 7

Figure 14:
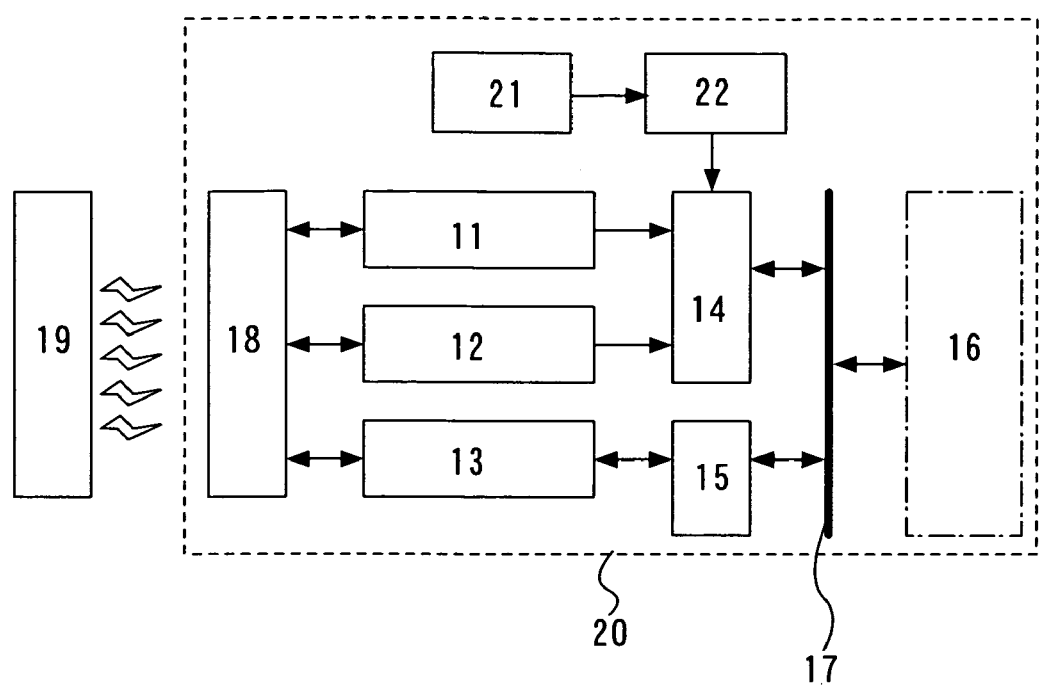
FIG. 14 is a diagram illustrating a structure of a semiconductor device according to the present invention.

In the present embodiment, a structure of a semiconductor device represented by a wireless chip will be described with reference to FIG. 14. As shown in FIG. 14, a semiconductor device 20 according to the present invention has a function of communicating data wirelessly, and includes a power supply circuit 11, a clock generation circuit 12, a data demodulation/modulation circuit 13, a control circuit 14 for controlling other circuits, an interface circuit 15, a memory circuit 16, a data bus 17, an antenna (antenna coil) 18, a sensor 21, and a sensor circuit 22.

In the power supply circuit 11, various kinds of power supplies that are supplied to each circuit in the semiconductor device 20, are generated in accordance with an alternating current signal inputted from the antenna 18. In the clock generation circuit 12, various kinds of clock signals that are supplied to each circuit in the semiconductor device 20, are generated in accordance with an alternative current signal inputted from the antenna 18. The data demodulation/modulation circuit 13 has a function of demodulating/modulating data communicated with a reader/writer 19. The controlling circuit 14 has a function of controlling the memory circuit 16. The antenna 18 has a function of sending/receiving electromagnetic fields or electric waves. The reader/writer 19 communicates with and controls the semiconductor device, and processes the data of the semiconductor device. It is to be noted that the structure of the semiconductor device is not limited to the above structure, and other elements, for example, such as a limiter circuit of a power supply voltage and hard ware dedicated to encryption may be additionally provided.

The memory circuit 16 has a memory element where an organic compound layer or a phase change layer is interposed between a pair of conductive films. It is to be noted that the memory circuit 16 may have only the memory element where an organic compound layer or a phase change layer is interposed between a pair of conductive films, or may have another memory circuit with a different structure. The memory circuit with a different structure corresponds, for example, to one or more selected from a DRAM, an SRAM, an FeRAM, a mask ROM, a PROM, an EPROM, an EEPROM, and a flash memory.

The sensor 21 includes a resistor element, a capacitive coupling element, an inductive coupling element, a photovoltaic element, a photoelectric converter, a thermal electromotive force element, a transistor, a thermistor, and a diode. The sensor circuit 22 detects changes in impedance, reactance, inductance, voltage, or current, and performs analog/digital (A/D) conversion to output a signal to the control circuit 14.

Embodiment 8

Figure 15A:
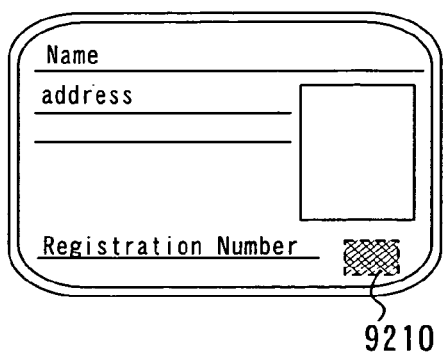
FIGS. 15A to 15F are views illustrating application examples of a semiconductor device according to the present invention.
Figure 15B:
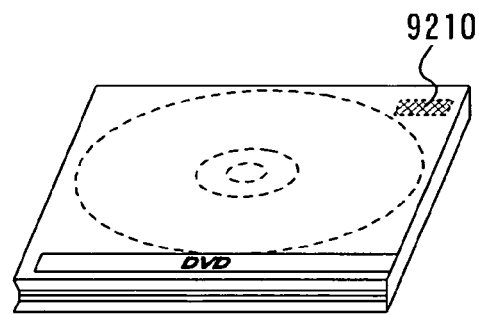
Figure 15C:
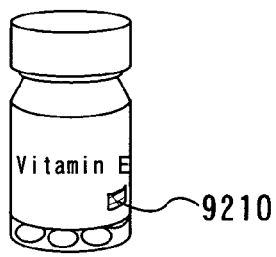
Figure 15D:
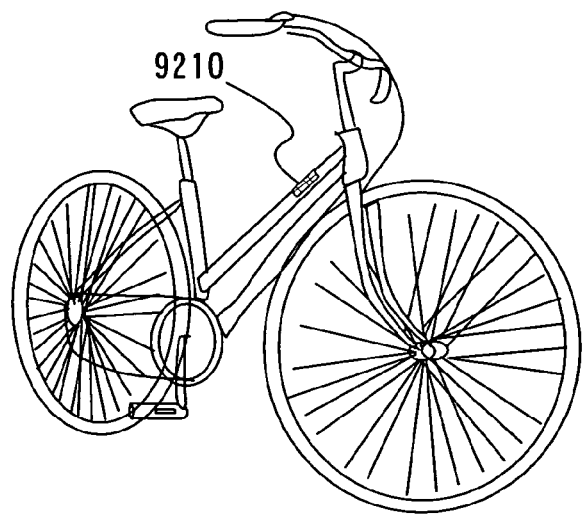
Figure 15E:
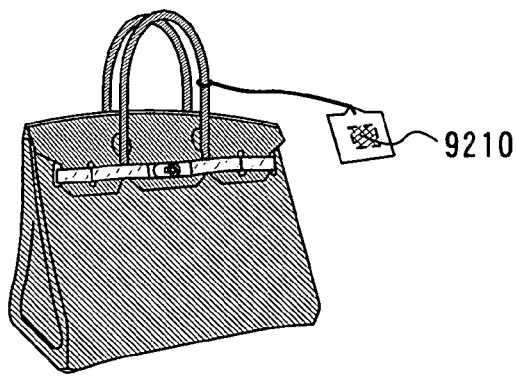
Figure 15F:
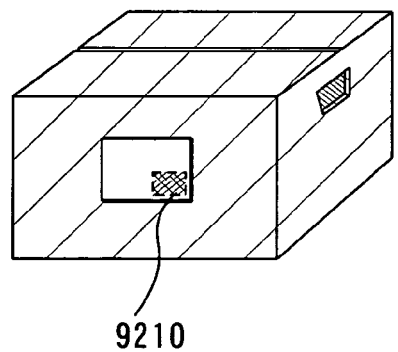

A semiconductor device serving as a wireless chip can be formed according to the present invention. The application of the semiconductor device ranges extensively. The semiconductor device may be mounted on various objects for example, such as bills, coins, securities, bearer bonds, certificates (driving licenses, resident cards and the like, refer to FIG. 15A), containers for wrapping objects (wrapping paper, bottles and the like, refer to FIG. 15C), recording media (DVDs, video tapes and the like, refer to FIG. 15B), vehicles (bicycles and the like, refer to FIG. 15D), personal belongings (bags, glasses and the like), foods, clothes, livingware, and goods of electronic apparatuses, or shipping tags of objects (refer to FIGS. 15E and 15F). The electronic apparatuses include liquid crystal display devices, EL display devices, television sets (also simply called televisions or television receivers), mobile phones, and the like. The semiconductor device can also be mounted on plants, animals, human body and the like.

A semiconductor device is attached to the surface of the object or incorporated in the object to be fixed. For example, a wireless chip may be incorporated in paper of a book, or in an organic resin of a package made from the organic resin. When a wireless chip is incorporated in bills, coins, securities, bearer bonds, certificates, and the like, forgery thereof can be prevented. In addition, when a wireless chip is incorporated in containers for wrapping objects, recording media, personal belongings, foods, clothes, livingware, electronic apparatuses, and the like, test systems, rental systems and the like can be performed more efficiently. A wireless chip according to the present invention is obtained in such a manner that a thin film integrated circuit formed over a substrate is separated by a known separation step and then attached to a cover material; therefore, the wireless chip can be reduced in size, thickness and weight and can be mounted on an object while keeping the attractive design. In addition, since such a wireless chip has flexibility, it can be attached to an object having a curved surface, such as bottles and pipes.

When a semiconductor device according to the present invention is applied to product management and distribution system, high performance system can be achieved. For example, when information stored in a semiconductor device mounted on a shipping tag is read by a reader/writer provided beside a conveyor belt, information such as distribution process and delivery address is read to easily inspect and distribute the object.

What is claimed is:

1. A method for manufacturing a substrate having a film pattern comprising:
   forming a film on a substrate in which silicon combines with oxygen and an inactive group;
   printing a composition on the film by screen printing method through mesh; and
   baking the composition to form a film pattern with a thickness of 5 to 40 µm, wherein the thickness is obtained after a single printing and baking.

2. The method for manufacturing the substrate having the film pattern according to claim 1, wherein the film pattern comprises a conductive material, an insulating material, or a semiconductor material.

3. The method for manufacturing the substrate having the film pattern according to claim 1, wherein the film is formed on an entire surface of the substrate.

4. The method for manufacturing the substrate having the film pattern according to claim 1, wherein the inactive group is a fluoroalkyl group or an alkyl group.

5. The method for manufacturing the substrate having the film pattern according to claim 1, wherein the film pattern has substantially the same width as opening portions of a screen printing plate.

6. A method for manufacturing a semiconductor device comprising:
   forming a film on an insulating film in which silicon combines with oxygen and an inactive group;
   printing a composition on the film by screen printing method through mesh; and
   baking the composition to form a film pattern with a thickness of 5 to 40 µm, wherein the thickness is obtained after a single printing and baking.

7. The method for manufacturing the semiconductor device according to claim 6, wherein the film is formed on an entire surface of the insulating film.

8. The method for manufacturing the semiconductor device according to claim 6, wherein the film pattern comprises a conductive material, an insulating material, or a semiconductor material.

9. The method for manufacturing the semiconductor device according to claim 6, wherein the film pattern has substantially the same width as opening portions of a screen printing plate.

10. A method for manufacturing a semiconductor device comprising:
    forming a semiconductor element over a substrate;
    forming a conductive film connecting to the semiconductor element;
    forming an insulating film covering the semiconductor element and the conductive film, the insulating film having an opening portion to expose part of the conductive film;
    forming a film on the insulating film and the exposed conductive film in which silicon combines with oxygen and an inactive group;
    printing a composition over the film by screen printing method through mesh; and
    baking the composition to form a conductive pattern with a thickness of 5 to 40 µm, wherein the thickness is obtained after a single printing and baking.

11. The method for manufacturing the semiconductor device according to claim 10, wherein the film is formed on entire surfaces of the insulating film and the exposed conductive film.

12. The method for manufacturing the semiconductor device according to a claim 10, wherein the conductive pattern serves as an antenna, an electrode, or a wiring.

13. The method for manufacturing the semiconductor device according to claim 10, wherein the inactive group is a fluoroalkyl group or an alkyl group.

14. The method for manufacturing the semiconductor device according to a claim 10, wherein the conductive pattern has substantially the same width as opening portions of a screen printing plate.

* * * * *